US010857762B2

(12) United States Patent
Okuyama et al.

(10) Patent No.: US 10,857,762 B2
(45) Date of Patent: Dec. 8, 2020

(54) POLYMER FILM COATED WITH A LAYER OF SILANE COUPLING AGENT

(71) Applicant: TOYOBO CO., LTD., Osaka (JP)

(72) Inventors: Tetsuo Okuyama, Otsu (JP); Naoki Watanabe, Otsu (JP); Issei Kobayashi, Otsu (JP); Toshiyuki Tsuchiya, Otsu (JP); Satoshi Maeda, Otsu (JP)

(73) Assignee: TOYOBO CO., LTD., Osaka (JP)

( * ) Notice: Subject to any disclaimer, the term of this patent is extended or adjusted under 35 U.S.C. 154(b) by 0 days.

(21) Appl. No.: 15/503,382

(22) PCT Filed: Aug. 24, 2015

(86) PCT No.: PCT/JP2015/073651
§ 371 (c)(1),
(2) Date: Apr. 17, 2017

(87) PCT Pub. No.: WO2016/031746
PCT Pub. Date: Mar. 3, 2016

(65) Prior Publication Data
US 2017/0225433 A1 Aug. 10, 2017

(30) Foreign Application Priority Data

Aug. 25, 2014 (JP) .................. 2014-170022
Jul. 8, 2015 (JP) .................. 2015-137014
Aug. 12, 2015 (JP) .................. 2015-159433

(51) Int. Cl.
C08J 7/00 (2006.01)
C08J 7/06 (2006.01)
B32B 27/34 (2006.01)
B32B 37/10 (2006.01)
B32B 9/04 (2006.01)
H01L 21/683 (2006.01)

(52) U.S. Cl.
CPC ................ *B32B 9/04* (2013.01); *B32B 27/34* (2013.01); *B32B 37/10* (2013.01); *C08J 7/00* (2013.01); *C08J 7/065* (2013.01); *H01L 21/6836* (2013.01); B32B 2255/20 (2013.01); B32B 2457/00 (2013.01); C08J 2379/08 (2013.01); Y02P 20/582 (2015.11)

(58) Field of Classification Search
CPC . B32B 9/04; B32B 37/10; B32B 27/34; C08J 7/065; C08J 7/00; C08J 2379/08; H01L 21/6836
USPC .......................... 427/458, 471, 472, 482, 485
See application file for complete search history.

(56) References Cited

U.S. PATENT DOCUMENTS 5,879,757 A * 3/1999 Gutowski ................ B05D 3/08
156/272.6
2006/0093838 A1* 5/2006 Kohayashi ................ C23C 4/12
428/457
2007/0170535 A1 7/2007 de Rochemont
2011/0021007 A1 1/2011 de Rochemont et al.
2011/0052809 A1* 3/2011 Huck ......................... C09J 5/02
427/255.25
2012/0080679 A1* 4/2012 Kushida .............. H01L 51/0529
257/57
2013/0095306 A1 4/2013 de Rochemont
2014/0083608 A1* 3/2014 Schubert .................... C09J 5/02
156/272.6
2015/0125665 A1* 5/2015 Nakase ................... B32B 37/12
428/172

FOREIGN PATENT DOCUMENTS

| DE | 69531394 T2 * | 6/2004 | ............... B05D 3/08 |
|---|---|---|---|
| JP | S63-299231 A | 12/1988 | |
| JP | 2006-123425 A | 5/2006 | |
| JP | 2008-019348 A | 1/2008 | |
| JP | 2008-159935 A | 7/2008 | |
| JP | 2009-260387 A | 11/2009 | |
| JP | 2010-283262 A | 12/2010 | |
| JP | 2011-011455 A | 1/2011 | |
| JP | 2011-516257 A | 5/2011 | |
| JP | 2011-245675 A | 12/2011 | |
| JP | 2012-252814 A | 12/2012 | |
| JP | 2013-538675 A | 10/2013 | |

(Continued)

OTHER PUBLICATIONS

Machine translation of WO-2014119648-A1 (Year: 2014).*
European Patent Office, Extended European Search Report in European Patent Application No. 15835799.6 (dated Mar. 23, 2018).
Japanese Patent Office, International Search Report in International Patent Application No. PCT/JP2015/073651 (dated Nov. 24, 2015).
Chinese Patent Office, Second Office Action in Chinese Patent Application No. 201580057459.8 (dated May 13, 2019).
Chinese Patent Office, First Office Action in Chinese Patent Application No. 201580057459.8 (dated Sep. 5, 2018).

(Continued)

*Primary Examiner* — Jose I Hernandez-Kenney
(74) *Attorney, Agent, or Firm* — Leydig, Voit & Mayer, Ltd.

(57) ABSTRACT

It is provided that a polymer film; a preparation method of the polymer film; and a laminated body used the polymer film. The polymer film is suitable for use in producing a laminate body which comprises a support and a polymer film, and is reduced in foreign-matter trapping and which can be used for supplying film devices using conventional apparatuses for glass substrates or silicon substrates. The polymer film coated with the layer of silane coupling agent, which is suitable for producing a laminate that comprises a support and a polymer film, comprises a silane coupling agent layer formed on at least one surface of the polymer film, wherein the silane coupling agent layer has a three-dimensional surface roughness (Sa) of 5.0 nm or less. The method of efficient for producing the polymer film coated with the above layer is the method for producing without using a vacuum.

4 Claims, 2 Drawing Sheets

(56) References Cited

FOREIGN PATENT DOCUMENTS

| WO | WO 2013/191052 A1 | 12/2013 | |
| WO | WO-2013191052 A1 * | 12/2013 | ............. H05K 3/007 |
| WO | WO 2014/115770 A1 | 7/2014 | |
| WO | WO 2014/119648 A1 | 8/2014 | |
| WO | WO-2014119648 A1 * | 8/2014 | ................ C09J 5/06 |

OTHER PUBLICATIONS

Japanese Patent Office, Notification of Reasons for Rejection in Japanese Patent Application No. 2016-545511 (dated Sep. 10, 2019).

China National Intelletual Property Administration, Fourth Office Action in Chinese Patent Application No. 201580057459.8 (dated Sep. 3, 2020).

\* cited by examiner

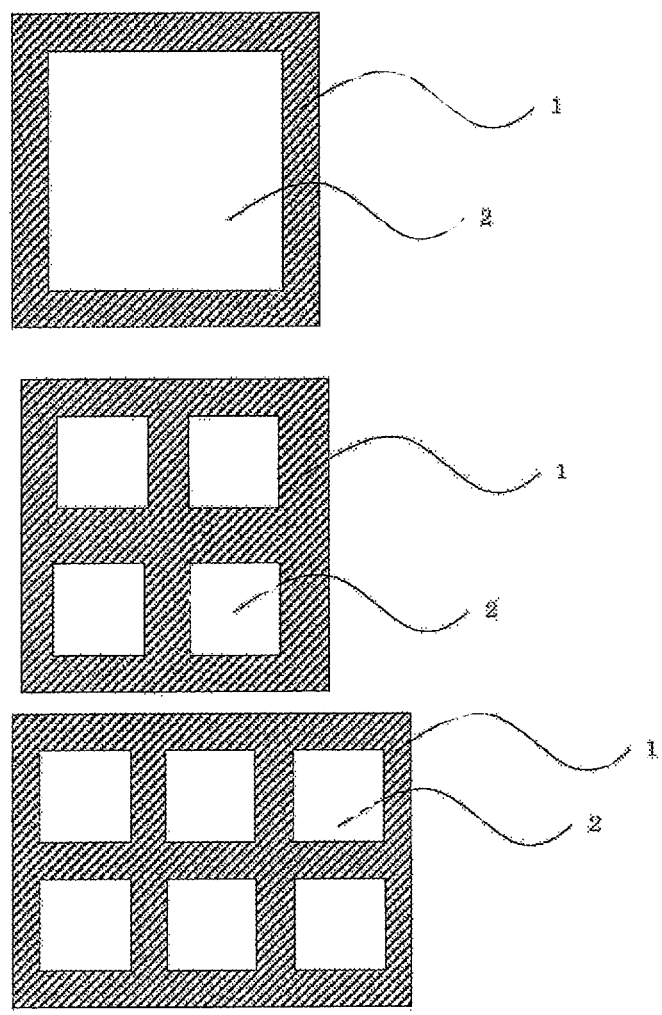

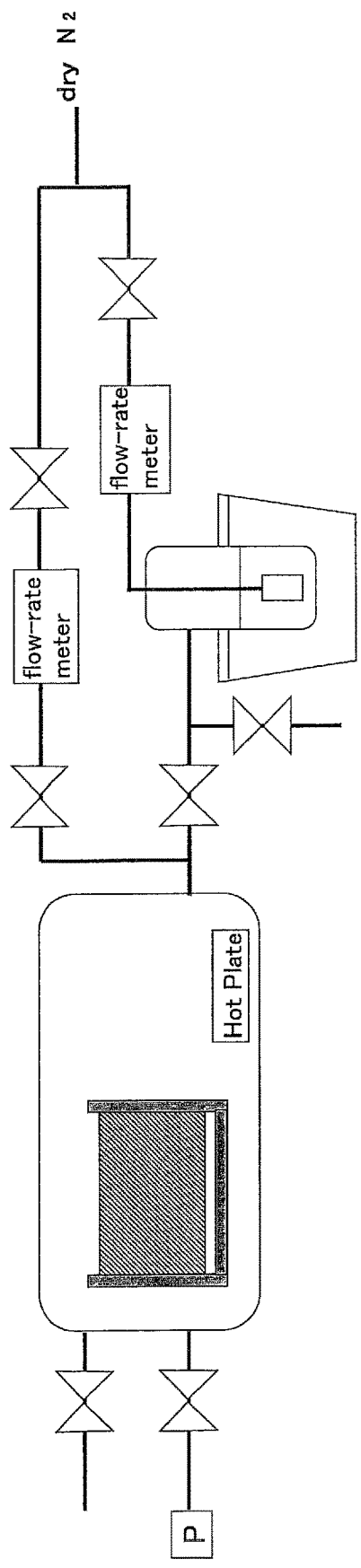
[Fig.2]

POLYMER FILM COATED WITH A LAYER OF SILANE COUPLING AGENT

CROSS-REFERENCE TO RELATED APPLICATIONS

This patent application is the U.S. national phase of International Patent Application No. PCT/JP2015/073651, filed Aug. 24, 2015, which claims the benefit of Japanese Patent Application No. 2014-170022, filed on Aug. 25, 2014, Japanese Patent Application No. 2015-137014, filed on Jul. 8, 2015, and Japanese Patent Application No. 2015-159433, filed on Aug. 12, 2015 which are incorporated by reference in their entireties herein.

TECHNICAL FIELD

The present invention relates to a polymer film suitable for producing a laminated body including a polymer film and a support, more particularly, to a polymer film which is capable of preparing a laminated body having heat resistance and which is suitable for preparing a film device including a laminated body in order to obtain a laminated body produced by, at the time of forming a device that is formed of a thin film of a semiconductor element, an MEMS element, a display element, or the like and that requires fine processing on a polymer film surface, temporarily or semi-permanently bonding a polymer film to a support made from an inorganic substance; a preparation method of the polymer film; a laminated body including the polymer film prepared by the method; and a flexible electronic device prepared by using the laminated body.

BACKGROUND ART

As electronic components in information communication equipment (e.g., broadcast equipment, mobile radios, portable communication equipment, etc.), radars, high speed information processors, and the like, functional elements (devices) such as a semiconductor element, an MEMS element, and a display element are used, but generally, they are conventionally formed or disposed on an inorganic substrate such as glass, a silicon wafer, and a ceramic-metal base material. In recent years, however, formation of various kinds of functional elements on a polymer film has been tried to correspond to a demand for making electronic components lightweight, miniature, thinner, and flexible.

At the time of forming various kinds of functional elements on a polymer film surface, processing by so-called roll-to-roll process based on flexibility, which is one of characteristics of a polymer film, is ideal. However, processing techniques for a rigid and planar substrate such as a wafer base or a glass substrate base have been the mainstream so far, in industrial fields such as semiconductor industries, MEMS industries, display industries, and the like. In order to form various kinds of functional elements on a polymer film surface by utilizing already existing infrastructure, a process has been contrived such that a polymer film is bonded to an inorganic substrate which serves as a rigid support and made from an inorganic substance (a glass plate, a ceramic plate, a silicon wafer, a metal plate, or the like) to form a desired element, and thereafter the polymer film is peeled from the support.

Generally, a step of forming a functional element often employs a relatively high temperature. For example, a temperature range of approximately 200 to 500° C. is employed in formation of a functional element such as polysilicon or an oxide semiconductor. Heating at approximately 450° C. may be required for dehydrogenation in preparation of a low temperature polysilicon thin film transistor. A temperature range of approximately 200 to 300° C. is required also in preparation of a hydrogenated amorphous silicon thin film. These exemplified temperature ranges are not so high temperature for inorganic materials but rather high temperature for a polymer film and an adhesive to be used generally for bonding a polymer film. In the above-mentioned techniques of bonding a polymer film to an inorganic substrate to form a functional element, and thereafter peeling the polymer film, processing of bonding a polymer film to an inorganic substrate by a pressure sensitive adhesive or an adhesive has conventionally been performed widely (Patent Document 1). Although an adhesive or a pressure sensitive adhesive used for bonding a polymer film is also required to have sufficient heat resistance, polymer films which can stand practical use in the high temperature range are limited as actual problems, and presently, there is no conventional adhesive or pressure sensitive adhesive for bonding, which has sufficient heat resistance.

A heat resistant adhesion means for temporarily bonding a polymer film to an inorganic substrate is not made available, so that in such use purposes, a technique is known in which a solution or a precursor solution of a polymer film is applied to an inorganic substrate to dry and cure the solution or the precursor solution on the inorganic substrate, thereby making a film for use in the use purposes. However, a polymer film obtained by the foregoing means is brittle and easy to be torn, so that the functional element may be often broken when the film is peeled from the inorganic substrate. Particularly, peeling of a large surface device is so extremely difficult that it is not possible to achieve an industrially satisfactory yield.

(Patent Document 2) discloses that by conducting the steps of forming a resin substrate on a fixed substrate with an amorphous silicon film as a peeling layer interposed therebetween, forming at least a TFT element on the foregoing resin substrate, and peeling the resin substrate on the amorphous silicon film from the foregoing fixed substrate by irradiating the amorphous silicon film with laser light, a display apparatus including the resin substrate and having flexibility is prepared; however at the time of peeling, laser irradiation and an etching means are employed for the adhesive layer, which results in complicated steps and high cost. The number of steps is increased for device manufacturers, but provision of those bearing a thin layer on a film side can lead to an advantage of a reduction in steps for device manufacturers.

(Patent Document 3) discloses that polymer films adhere to each other by UV irradiation and also discloses that use of a coupling agent at that time is effective. The document concerns only the adhesion of polymer films, and does not perform control of the adhesion and peeling power of the coupling agent itself by UV light irradiation.

In view of the above circumstances, inventors of the present invention have proposed, as a laminated body of a polymer film for forming a functional element and a support, laminated bodies obtained by bonding to a support (an inorganic layer) formed of an inorganic substance a polyimide film that is excellent in heat resistance, is tough, and is possible to be a thin film with a coupling agent interposed therebetween (Patent Documents 4 to 6).

PRIOR ART DOCUMENT

Patent Documents

Patent Document 1: JP-A-2008-159935
Patent Document 2: JP-A-2009-260387

Patent Document 3: JP-A-2008-19348
Patent Document 4: JP-A-2010-283262
Patent Document 5: JP-A-2011-11455
Patent Document 6: JP-A-2011-245675

SUMMARY OF THE INVENTION

Problems to be Solved by the Invention

The above-mentioned laminated bodies described in Patent Documents 4 to 6 enable bonding of a polymer film and an inorganic substrate to each other with no use of a so-called adhesive- or pressure sensitive adhesive-like factor, and further the laminated bodies cause no peeling of the polymer film even if being exposed to a high temperature required for production of thin film devices. Accordingly, use of the laminated bodies for a process of forming an electronic device directly on a conventional inorganic substrate such as a glass plate, a silicon wafer, or the like can make production of the electronic device on the polymer film possible and can actualize production of a flexible electronic device by peeling the polymer film from the inorganic substrate.

However, there still remain the following industrial production problems in the techniques. A yield is problematic in the case of production of particularly highly fine electronic devices. When a foreign matter is mixed between the polymer film and the inorganic substrate, a tent-like structure including the foreign matter as a pole is formed on the foreign matter and its periphery. This generates a void between the polymer film and the inorganic substrate and thus results in formation of a part that is not partially bonded. A gas enclosed in the void is expanded under heating environment or reduced pressure environment to cause an expansion defect (also referred to as a blister). Further, since the void part is not bonded, the adhesive strength is significantly fluctuated in view of macroscopic adhesive strength.

The polymer film itself rises up in the periphery where the foreign matter exists, and the rising up particularly becomes a hindrance at the time of pattern formation by employing photolithography or highly fine pattern formation of microcontact printing, so that good electronic device formation may not be performed in some cases.

The foreign matter can be reduced by cleaning the inorganic substrate surface and the polymer film surface and making the working environment clean. However, foreign matter generation attributed to a silane coupling agent itself is an essential problem on the techniques. The exemplified conventional techniques described an example in which a solvent solution of a silane coupling agent is directly applied to an inorganic substrate. The inventors of the present invention have found the followings: a silane coupling agent tends to form an aggregate by the effect of moisture or the like existing in the handling environment, and in the exemplified direct application method, the aggregate of the silane coupling agent formed unintentionally in a solution might also be applied, so that the aggregate is applied as a foreign matter together with the silane coupling agent on the inorganic substrate. The adverse effects of the foreign matter are as described above.

The present invention has been made on focusing the foregoing circumferences, and an object of the invention is to solve the problems on industrial production by the followings: a silane coupling agent application method is fundamentally changed to prevent adhesion of an aggregate of a silane coupling agent to an inorganic substrate, so that a laminated body is provided which is excellent in quality and which has even adhesive force between the polymer film and the inorganic substrate.

The present invention can lessen the roughness of the inorganic substrate surface after polymer film peeling, make the inorganic substrate usable as a substrate by re-application of a silane coupling agent after simple cleaning operation, and remarkably improves recycling properties of the inorganic substrate.

Solutions to the Problems

The inventors of the present invention have made various investigations to solve the above-mentioned problems, and consequently have found the followings: silane coupling agent application to a polymer film in a vapor phase can provide a good laminated body having no foreign matter between a polymer film and an inorganic substrate, and consequently it is possible to make production of a highly fine flexible electronic device at a high yield, and furthermore recycling properties of the inorganic substrate can be improved. These findings have led to completion of the present invention.

That is, the present invention is configured as follows.

1. A polymer film coated with a layer of silane coupling agent comprising a silane coupling agent layer formed on at least one surface of the polymer film, wherein the silane coupling agent layer has a three-dimensional surface roughness (Sa) of 5.0 nm or less.

2. The polymer film coated with the layer of silane coupling agent according to 1, wherein a number of foreign matter containing silicon with a major axis of 10 μm or longer in the silane coupling agent layer is 2000 pieces/m² or less.

3. The polymer film coated with the layer of silane coupling agent according to 1 or 2, wherein the silane coupling agent layer forms a prescribed pattern.

4. The polymer film coated with the layer of silane coupling agent according to 1 to 3, wherein the polymer film is a polymer film having an area of 1000 cm² or more.

5. The polymer film coated with the layer of silane coupling agent according to one of 1 to 4, wherein the polymer film is a polyimide film.

6. A method for producing the polymer film coated with the layer of silane coupling agent according to any one of 1 to 5, comprising a step of forming a silane coupling agent layer by exposing the polymer film to a vaporized silane coupling agent, wherein vacuum is not used in the step.

7. The method for producing the polymer film coated with the layer of silane coupling agent according to 6, comprising a step of forming the silane coupling agent layer by exposing the polymer film to a silane coupling agent vaporized in a bubbling manner.

8. The method for producing the polymer film coated with the layer of silane coupling agent according to 7, wherein a dry gas with a dew point of 0° C. or lower is used as a carrier gas when the silane coupling agent is vaporized.

9. The method for producing the polymer film coated with the layer of silane coupling agent according to any one of 6 to 8, wherein a gas with a dew point of 5° C. or higher is co-existed when the polymer film is exposed to the vaporized silane coupling agent.

10. The method for producing the polymer film coated with the layer of silane coupling agent according to any one of 6 to 8, wherein an electric field is applied to the polymer film when the polymer film is exposed to the vaporized silane coupling agent.

11. A method for producing the polymer film coated with the layer of silane coupling agent according to any one of 3 to 5, wherein a pattern is formed by masking a part of the polymer film when the silane coupling agent layer is formed.

12. A method for producing the polymer film coated with the layer of silane coupling agent according to any one of 3 to 5, wherein a prescribed pattern is formed by irradiating a part of the silane coupling agent layer with an active energy ray after formation of the silane coupling agent layer.

13. A laminated body comprising at least one inorganic substrate and at least one the polymer film coated with the layer of silane coupling agent according to any one of 1 to 5 bonded to each other, wherein a peel strength between the inorganic substrate and the polymer film is 0.3 N/cm or more and 15 N/cm or less.

14. A laminated body comprising at least one inorganic substrate and at least one the polymer film coated with the layer of silane coupling agent according to any one of 1 to 5 bonded to each other, wherein the laminated body has a well adhering part and an easily peelable part different in peel strength between the inorganic substrate and the polymer film; and the well adhering part has a peel strength of 0.3 N/cm or more and 15 N/cm or less, and the easily peelable part has a peel strength of lower than 0.3 N/cm and smaller than the peel strength of the well adhering part by 0.1 N/cm or more.

15. A method for producing a laminated body, comprising steps of (1) to (3) below:

(1) forming a silane coupling agent layer on a polymer film by exposing the polymer film to a vaporized silane coupling agent;

(2) superposing the polymer film in which the silane coupling agent layer is subjected to an active energy irradiation treatment on an inorganic substrate; and (3) bonding the two by pressurization.

16. A method for producing a flexible electronic device, comprising:

using the laminated body according to 13;

forming an electronic device on the polymer film of the laminated body; and peeling the electronic device together with the polymer film from the polymer film.

17. A method for producing a flexible electronic device, comprising:

using the laminated body according to 14;

forming an electronic device on a part corresponding to the easily peelable part in the polymer film of the laminated body;

slitting the polymer film along an outer circumference of the easily peelable part of the laminated body; and peeling the electronic device together with the polymer film from the polymer film.

Effects of the Invention

The present invention can provide a good laminated body having no foreign matter between a polymer film and an inorganic substrate, and as a result, the adhesive strength between the polymer film and the inorganic substrate can be made even. Further, according to the present invention, it is possible to discriminately forming, in a desired pattern, a well adhering part having sufficient adhesive force so as not to generate peeling of a polymer film and an easily peelable part capable of peeling a polymer film relatively easily at the time of device formation process, and it is also possible to separate a functional element part formed in a corresponding part by slitting along the periphery of the easily peelable part, when an electronic device is formed with the presence/absence or strength/weakness of adhesive force in an intentional manner by partially masking a polymer film in a prescribed pattern for a silane coupling layer at the time of the silane coupling agent formation or by carrying out active energy beam irradiation along a prescribed pattern partially for a silane coupling agent layer after silane coupling agent layer formation.

The present invention makes the inorganic substrate surface highly smooth after polymer film peeling, and causes an effect to make the inorganic substrate usable as a material for a laminated body by relatively simple cleaning operation and by forming a silane coupling layer again.

The present invention can make the laminated body usable as a reinforcing substrate by bonding a polyimide film in the present invention for solar cells that have been made thinner, are made of single crystal or polycrystalline Si, are easily cracked due to the thinness, and thus have problems of handling during processing and of durability as final products. In this case, since there are parts easy to be peeled, a reinforcing substrate out of which electrodes can be led can be prepared.

In the present invention, use of a polymer film having high heat resistance is more preferable since the polymer film makes bonding possible without using an adhesive or a pressure sensitive adhesive inferior in heat resistance, and makes element formation possible at a high temperature of 180° C. or higher, preferably 230° C. or higher, and further preferably 260° C. or higher at the time of functional element formation. In general, since a semiconductor, a dielectric, or the like can be a thin film with better film quality when made at a higher temperature, formation of a functional element with higher performance can be expected. The present invention is useful for production of a flexible electronic device, which is a device such as a dielectric element, a semiconductor element, an MEMS element, a display element, a light emitting element, a photoelectric conversion element, a piezoelectric conversion element, a thermoelectric conversion element, and the like formed on a film.

BRIEF DESCRIPTION OF THE DRAWINGS

FIG. 1 is a view showing a pattern example.
FIG. 2 is a conceptual diagram of a vapor phase method.

MODE FOR CARRYING OUT THE INVENTION (Laminated Body and Production Method)

A laminated body according to the present invention comprises at least an inorganic substrate, a silane coupling agent, and a polymer film.

<Inorganic Substrate>

In the present invention, an inorganic substrate is used as a support for a polymer film. The inorganic substrate may be a plate-like substrate that is formed of an inorganic substance and is usable as a substrate, and examples of the support include one formed mainly of a glass plate, a ceramic plate, a silicon wafer or a metal, and as a composite made from the glass plate, the ceramic plate, the semiconductor wafer and the metal, one prepared by stacking them, one prepared by allowing them to be dispersed in the support, one containing fibers thereof, or the like.

Examples of the glass plate may include quartz glass, high silicate glass (96% silica), soda-lime glass, lead glass, aluminoborosilicate glass, borosilicate glass (Pyrex (registered trademark)), borosilicate glass (alkali-free), borosilicate glass (microsheet), aluminosilicate glass, and the like. Among them, those having a coefficient of linear thermal expansion of 5 ppm/K or lower are desirable, and "Corning (registered trademark) 7059", "Corning (registered trademark) 1737", and "EAGLE XG" manufactured by Corning; "AN 100" manufactured by Asahi Glass Co., Ltd.; "OA 10" manufactured by Nippon Electric Glass Co., Ltd.; and "AF 32" manufactured by SCHOTT are desirable as commercialized products.

Examples of the ceramic plate include ceramics for substrate such as $Al_2O_3$, Mullite, AlN, SiC, $Si_3N_4$, BN, crystallized glass, Cordierite, Spodumene, Pb-BSG+$CaZrO_3$+$Al_2O_3$, Crystallized glass+$Al_2O_3$, Crystallized Ca-BSG, BSG+Quartz, BSG+Quartz, BSG+$Al_2O_3$, Pb+BSG+$Al_2O_3$, Glass-ceramic and Zerodur material; capacitor materials such as $TiO_2$, strontium titanate, calcium titanate, magnesium titanate, alumina, MgO, steatite, $BaTi_4O_9$, $BaTiO_3$, $BaTi_4$+$CaZrO_3$, $BaSrCaZrTiO_3$, $Ba(TiZr)O_3$, PMN-PT and PFN-PFW; and piezoelectric materials such as $PbNb_2O_6$, $Pb_{0.5}Be_{0.5}Nb_2O_6$, $PbTiO_3$, $BaTiO_3$, PZT, 0.855PZT-95PT-0.5BT, 0.873PZT-0.97PT-0.3BT and PLZT.

As the semiconductor wafer, a silicon wafer, a semiconductor wafer, a compound semiconductor wafer, and the like may be used, and examples of the silicon wafer include those obtained by processing single crystal or polycrystalline silicon on a thin plate, an n-type or p-type doped silicon wafer, and all of intrinsic silicon wafers, and moreover, a silicon wafer on the surface of which a silicon oxide layer and various thin films are deposited is also included. In addition to the silicon wafer, semiconductor wafers such as germanium, silicon-germanium, gallium-arsenic, aluminum-gallium-indium, nitrogen-phosphorus-arsenic-antimony, SiC, InP (indium phosphide), InGaAs, GaInNAs, LT, LN, ZnO (zinc oxide), CdTe (cadmium tellurium) and ZnSe (zinc selenide); and compound semiconductor wafers may also be used.

Examples of the metal include single elemental metals such as W, V, Mo, Pt, Fe, Ni, Au and Cu, and alloys such as Inconel, Monel, Nimonic, carbon copper, an Fe—Ni based invar alloy and a super invar alloy. Examples thereof also include multilayer metal plates prepared by adding other metal layers and ceramic layers to the above-mentioned metal. In this case, when the CTE of the whole layer including the additional layer is low, Cu, Al and the like are also used for the main metal layer. Although the metal used as an additional metal layer is not limited as long as the metal is one that allows the adhesiveness to the polyimide film to be strengthened or one that has characteristics of not causing the diffusion, being satisfactory in chemical resistance and heat resistance, and the like, preferred examples thereof include chromium, nickel, TiN and Mo-containing Cu.

The planar part of the inorganic substrate is desirable to be sufficiently flat. Specifically, the P-V value of the surface roughness is 50 nm or less, more preferably 20 nm or less, and further preferably 5 nm or less. When the surface is rougher than this, the adhesive strength between the polymer film and the inorganic substrate may be insufficient in some cases.

The thickness of the inorganic substrate is not particularly limited, but from the viewpoint of handleability, the thickness is preferably 10 mm or less, more preferably 3 mm or less, and furthermore preferably 1.3 mm or less. The lower limit of the thickness is not particularly limited, but is 0.07 mm or more, preferably 0.15 mm or more, and more preferably 0.3 mm or more.

The area of the inorganic substrate preferably has a large area from the viewpoint of production efficiency and cost of a laminated body and a flexible electronic device. The surface are is preferably 1000 $cm^2$ or more, more preferably 1500 $cm^2$ or more, and furthermore preferably 2000 $cm^2$ or more.

The cleaning of the inorganic substrate surface by means of short wavelength UV/ozone irradiation or the like, or the cleaning of the inorganic substrate surface with a liquid detergent is a preferable operation.

<Silane Coupling Agent>

A silane coupling agent in the present invention means a compound that is physically or chemically interposed between a temporary support and a polymer film to enhance the adhesive force between the two.

Specific preferable examples of the silane coupling agent include N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, vinyltrichlorosilane, vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-stylyltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-phenyl-3-aminopropyltrimethoxysilane, N-(vinylbenzyl)-2-aminoethyl-3-aminopropyltrimethoxysilane hydrochloride, 3-ureidopropyltriethoxysilane, 3-chloropropyltrimethoxysilane, 3-mercaptopropylmethyldimethoxysilane, 3-mercaptopropyltrimethoxysilane, bis(triethoxysilylpropyl)tetrasulfide, 3-isocyanatepropyltriethoxysilane, tris-(3-trimethoxysilylpropyl)isocyanurate, chloromethylphenethyltrimethoxysilane, chloromethyltrimethoxysilane, aminophenyltrimethoxysilane, aminophenethyltrimethoxysilane, aminophenyl aminomethylphenethyltrimethoxysilane, hexamethyldisilazane, and the like.

Examples of the silane coupling agent usable in the present invention may also include, in addition to those described above, n-propyltrimethoxysilane, butyltrichlorosilane, 2-cyanoethyltriethoxysilane, cyclohexyltrichlorosilane, decyltrichlorosilane, diacetoxydimethylsilane, diethoxydimethylsilane, dimethoxydimethylsilane, dimethoxydiphenylsilane, dimethoxymethylphenylsilane, dodecyl chlorosilane, dodecyltrimethoxysilane, ethyltrichlorosilane, hexyltrimethoxysilane, octadecyltriethoxysilane, octadecyltrimethoxysilane, n-octyltrichlorosilane, n-octyltriethoxysilane, n-octyltrimethoxysilane, triethoxyethylsilane, triethoxymethylsilane, trimethoxymethylsilane, trimethoxyphenylsilane, pentyltriethoxysilane, pentyltrichlorosilane, triacetoxymethylsilane, trichlorohexylsilane, trichloromethylsilane, trichlorooctadecylsilane, trichloropropylsilane, trichlorotetradecylsilane, trimethoxypropylsilane, allyltrichlorosilane, allyltriethoxysilane, allyltrimethoxysilane, diethoxymethylvinylsilane, dimethoxymethylvinylsilane, trichlorovinylsilane, triethoxyvinylsilane, vinyltris(2-methoxyethoxy)silane, trichloro-2-cyanoethylsilane, diethoxy(3-glycidyloxypropyl)methylsilane, 3-glycidyloxypropyl(dimethoxy)methylsilane, 3-glycidyloxypropyltrimethoxysilane, and the like.

Further, the silane coupling agent may be mixed appropriately with other alkoxysilanes such as tetramethoxysilane and tetraethoxysilane.

When the silane coupling agent is mixed appropriately with other alkoxysilanes such as tetramethoxysilane and tetraethoxysilane, or is not mixed appropriately with other alkoxysilanes, the silane coupling agent may be mixed and subjected to heating operation to slightly cause reaction and then used.

Among the silane coupling agents, a silane coupling agent to be used preferably for the present invention is one having a chemical structure in which one silicon atom exists per one molecule.

Examples of the particularly preferable silane coupling agent in the present invention include N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, aminophenyltrimethoxysilane, aminophenethyltrimethoxysilane, aminophenyl aminomethylphenethyl trimethoxysilane. In the case of being required to have particularly high heat resistance in the process, those having an aromatic group connecting Si and an amino group are desirable.

In the present invention, a phosphorus type coupling agent, a titanate type coupling agent, or the like may be used in combination, if necessary.

<Method for Applying Silane Coupling Agent>

In a conventional technique, application of a silane coupling agent is carried out in a solution state of a silane coupling agent diluted with a solvent such as an alcohol. However, the present invention is characterized in that a step of applying the silane coupling agent is carried out in a vapor phase. That is, in the present invention, vaporization means the state where vapor of a silane coupling agent exists, in other words, a silane coupling agent exists in a substantially gaseous state or a silane coupling agent exists in fine particle state when a polymer film is exposed to a vaporized silane coupling agent. Herein, exposure means that a polymer film is brought into contact with a gas containing the vaporized silane coupling agent or a vacuum state containing the vaporized silane coupling agent. The application is carried out by this exposure. The vapor of a silane coupling agent can be obtained by heating a silane coupling agent in a liquid state to a temperature of 40° C. to the boiling point of the silane coupling agent. Since the above-mentioned vapor exists even at a temperature lower than the above range, the vapor may be used and a state in which the fine particles of the silane coupling agent coexist may also be used. An operation for increasing the vapor density by temperature and pressure operation may additionally be carried out. Although being different depending on the chemical structure, the boiling point of the silane coupling agent is in a range of around 100 to 250° C. However, heating at 200° C. or higher is not preferable since this heating may possibly cause a side reaction in an organic group side of silane coupling agent.

An environment for heating the silane coupling agent may be any of under pressurization, under approximately normal pressure, and under reduced pressure; but when the vaporization of the silane coupling agent is accelerated, the environment is preferably under approximately normal pressure or under reduced pressure. Since many silane coupling agents are combustible liquids, it is preferable to carry out vaporization in a closed container, preferably in a container after the gas in the container is replaced with an inert gas. However, from the viewpoint of improvement of production efficiency and decrease of cost for production facilities, the silane coupling agent application is preferably carried out in an environment without vacuum. A method for depositing a silane coupling agent in an environment without vacuum in the present invention means not only that no vacuum is employed merely at the time of deposition, but also that the steps from setting a polymer film in a normal atmosphere, replacing the gas with a carrier gas, depositing the silane coupling agent, and then to returning to a state of absence of the silane coupling agent are carried out in approximately atmospheric pressure.

The time of exposure of the polymer film to the silane coupling agent is not particularly limited, but is within 20 hours, preferably within 60 minutes, more preferably within 15 minutes, and furthermore preferably within 1 minute.

The temperature of the polymer film during the time of exposure of the polymer film to the silane coupling agent is preferably controlled to be a proper temperature between −50° C. and 200° C. depending on the type of the silane coupling agent and the thickness of the silane coupling agent layer to be desired.

The polymer film exposed to the silane coupling agent is heated at preferably 70° C. to 200° C. and more preferably 75° C. to 150° C. after the exposure. The heating causes the reaction of hydroxyl groups in the polymer film surface with alkoxy groups or silazane groups of the silane coupling agent to complete a silane coupling agent treatment. The time required for the heating is 10 seconds or longer and within approximately 10 minutes. If the temperature is too high or the time is too long, the coupling agent may possibly be deteriorated in some cases. On the other hand, too short time fails to attain the treatment effect. When the substrate temperature during the exposure to the silane coupling agent is already 80° C. or higher, heating after the exposure may be omitted.

In the present invention, the polymer film is preferably exposed to the silane coupling agent vapor with the surface of the polymer film to be coated with the silane coupling agent being held downward. In a conventional method for applying a solution of a silane coupling agent, since the surface of a polymer film to be coated with a solution of a silane coupling agent is inevitably faced upward during the application as well as before and after the application, the possibility of precipitation of foreign matters floating in the work environment on an inorganic substrate surface cannot be denied. However, in the present invention, since the polymer film can be held downward, adhesion of foreign matters in the environment can greatly be lowered.

At the time of introduction of the gas containing the vaporized silane coupling agent into a chamber where a polymer substrate is exposed to the gas containing the vaporized silane coupling agent, it is also effective to separate the gas once into 2 or more portions to be introduced and to allow the 2 or more portions of the gas to collide with one another in the chamber, so that turbulence is generated to make the silane coupling agent distribution uniform.

A manner for vaporizing the silane coupling agent may be a manner for generating bubbles by introducing a gas into a silane coupling agent liquid, in addition to vapor evaporation by heating. Hereinafter, this will be referred to as bubbling. The bubbling is effectively carried out by simply inserting a pipe for leading a gas into a silane coupling agent liquid, by generating numerous fine bubbles with attachment of a porous body at the tip end of a pipe, or by accelerating vaporization with superposition of ultrasonic wave.

Further, there are many vaporized silane coupling agents that bear electric charge, and the silane coupling agents can be more largely deposited in a short time by applying an electric field at the time of exposure to the film, and since the silane coupling agents have kinetic energy, a deposited film is suppressed to be an island-like film. It is known that if the carrier gas to be used contains water, a reaction of the water and the silane coupling agent starts. For this reason, a low dew point is effective. The dew point is desirably 15° C. or lower, more desirably 10° C. or lower, and furthermore desirably 5° C. or lower.

It is a preferable embodiment of the present invention that the number of silicon-containing foreign matters with a major axis of 10 μm or longer in a silane coupling agent layer of the polymer film coated with the layer of silane coupling agent is set to 2000 pieces/m$^2$ or less, preferably 1000 pieces/m$^2$ or less, further preferably 500 pieces/m$^2$ or less. The number of silicon-containing foreign matters can be attained by combining the above-mentioned operations.

The application amount and thickness of the coupling agent is sufficient theoretically to be a mono-molecular layer, and is sufficient in a negligible level in terms of mechanical design. The thickness is generally less than 200 nm (less than 0.2 μm), preferably 150 nm or less (0.15 μm or less), further preferably, for practical use, 100 nm or less (0.1 μm or less), more preferably 50 nm or less, and furthermore preferably 10 nm or less. However, if the thickness is mathematically in a range of 5 nm or less, the coupling agent may be assumed to exist in a cluster manner, not in the form of a uniform coating film, and it is therefore not preferable. The silane coupling agent layer is required to closely adhere to the inorganic substrate for adhesion. The contact is not through a liquid or a soft layer, but is a solid with a solid, and thus adhesion is impossible without contact at first. Although having flexibility, the film cannot follow fine surface roughness, and accordingly the surface roughness is required to be 5.0 nm or less, desirably 3.0 nm or less, and more desirably 1.0 nm or less.

The thickness of the coupling agent layer can be determined by an ashing method through an ellipsometry method, an X-ray fluorescence method, or an ICP spectroscopy, or by calculation from the concentration and application amount of the coupling agent solution at the time of application.

<Patterning Treatment in Inorganic Substrate Side>

In the present invention, a patterning treatment may be carried out in the inorganic substrate side. Herein, patterning means formation of regions in which activity of surface activation treatment is intentionally adjusted. The patterning can provide a well adhering part and an easily peelable part with different adhesive strength between an inorganic substrate and a polymer film in a laminated body, and can form prescribed patterns of the well adhering part and easily peelable part. An example of the surface activation treatment as a patterning treatment may be a method for controlling the degree of surface activation treatment by using a mask previously prepared to have prescribed patterns. Further, a means of masking and scanning operation may be employed in combination to carry out patterning at the time of the surface activation treatment. Further, after the surface activation, masking and scanning to the inorganic substrate surface may be carried out in combination at the time of another active energy beam treatment to weaken or strengthen the activity. Herein, the active energy beam irradiation includes irradiation with energy beams such as ultraviolet rays, electron beams, and X-rays, as well as an ultraviolet irradiation treatment with extremely short wavelength which can cause an ultraviolet irradiation effect and simultaneously which can cause an effect of exposure to ozone gas generated in the periphery of the irradiated surface. In addition to these, treatments such as corona treatment, vacuum plasma treatment, normal pressure plasma treatment, and sand blast can be employed to carry out the patterning treatment.

<Polymer Film>

Films usable as a polymer film in the present invention may be made from polyethylene, polypropylene, polyethylene terephthalate, polybutylene terephthalate, polyethylene naphthalate, fully aromatic polyester, other copolymer polyester, polymethyl methacrylate, other copolymer acrylate, polycarbonate, polyamide, polysulfone, polyether sulfone, polyether ketone, polyamideimide, polyether imide, aromatic polyimide, alicyclic polyimide, fluorinated polyimide, cellulose acetate, cellulose nitrate, aromatic polyamide, polyvinyl chloride, polyphenol, polyarylate, polyphenylene sulfide, polyphenylene oxide, and polystyrene. In the present invention, those that are significantly effective and usable are particularly polymers, so-called engineering plastic films, having a heat resistance of 100° C. or higher. Herein, heat resistance means glass transition temperature or heat distortion temperature.

The polymer film in the present invention can be obtained by a melt drawing method in the case of a thermoplastic polymer material among the above-mentioned polymer materials.

The thickness of the polymer film in the present invention is preferably 3 μm or more and more preferably 11 μm or more. The upper limit of the thickness of the polymer film is not particularly limited, but is preferably 250 μm or less, further preferably 150 μm or less, and furthermore preferably 90 μm or less in terms of requirement as a flexible electronic device.

The area of the polymer film in the present invention preferably has a large area from the viewpoint of production efficiency and cost of a laminated body or a flexible electronic device. The surface are is preferably 1000 cm$^2$ or more, more preferably 1500 cm$^2$ or more, and furthermore preferably 2000 cm$^2$ or more.

The polymer film to be used particularly preferably in the present invention is a polyimide film, and a film made from aromatic polyimide, alicyclic polyimide, polyamideimide, or polyether imide may be used. When the present invention is employed for flexible display element production, the use of a polyimide-based resin film that is colorless and transparent is preferable, but when a back side element of a reflection type or spontaneous light emission type display is formed, the film to be used is not particularly limited thereto.

Generally, a polyimide film is obtained by applying a polyamic acid (polyimide precursor) solution obtained by a reaction of diamines and tetracarboxylic acids in a solvent to a support for polyimide film preparation, drying the coating film to prepare a green film (also referred to as a precursor film or a polyamic acid film), and furthermore, subjecting the green film on the support for polyimide film preparation or after being peeled from the support to a high temperature heat treatment to perform a dehydrative ring-closing reaction.

The diamines constituting the polyamic acid are not particularly limited, and aromatic diamines, aliphatic diamines, and alicyclic diamines used commonly for polyimide synthesis can be used. From the viewpoint of heat resistance, aromatic diamines are preferable, and among the aromatic diamines, aromatic diamines having a benzoxazole structure are more preferable. The use of the aromatic diamines having a benzoxazole structure can provide high heat resistance as well as high elastic modulus, low heat shrinkability, and low coefficient of linear thermal expansion. The diamines may be used alone or two or more may be used in combination.

Examples of the aromatic diamines having a benzoxazole structure include, but are not particularly limited to, 5-amino-2-(p-aminophenyl)benzoxazole, 6-amino-2-(p-aminophenyl)benzoxazole, 5-amino-2-(m-aminophenyl)benzoxazole, 6-amino-2-(m-aminophenyl)benzoxazole, 2,2'-p-phenylenebis(5-aminobenzoxazole), 2,2'-p-phenylenebis(6-aminobenzoxazole), 1-(5-aminobenzoxazolo)-4-(6-aminobenzoxazolo)benzene, 2,6-(4,4'-diaminodiphenyl)benzo[1,2-d:5,4-d']bisoxazole, 2,6-(4,4'-diaminodiphenyl)benzo[1,2-d:4,5-d']bisoxazole, 2,6-(3,4'-diaminodiphenyl)benzo[1,2-d:5,4-d']bisoxazole, 2,6-(3,4'-diaminodiphenyl)benzo[1,2-d:4,5-d']bisoxazole, 2,6-(3,3'-diaminodiphenyl)benzo[1,2-d:5,4-d']bisoxazole, 2,6-(3,3'-diaminodiphenyl)benzo[1,2-d:4,5-d']bisoxazole, and the like.

Examples of aromatic diamines other than the aromatic diamines having a benzoxazole structure include 2,2'-dimethyl-4,4'-diaminobiphenyl, 1,4-bis[2-(4-aminophenyl)-2-propyl]benzene (bisaniline), 1,4-bis(4-amino-2-trifluoromethylphenoxy)benzene, 2,2'-ditrifluoromethyl-4,4'-diaminobiphenyl, 4,4'-bis(4-aminophenoxy)biphenyl, 4,4'-bis(3-aminophenoxy)biphenyl, bis[4-(3-aminophenoxy)phenyl]ketone, bis[4-(3-aminophenoxy)phenyl]sulfide, bis[4-(3-aminophenoxy)phenyl]sulfone, 2,2-bis[4-(3-aminophenoxy)phenyl]propane, 2,2-bis[4-(3-aminophenoxy)phenyl]-1,1,1,3,3,3-hexafluoropropane, m-phenylenediamine, o-phenylenediamine, p-phenylenediamine, m-aminobenzylamine, p-aminobenzylamine, 3,3'-diaminodiphenyl ether, 3,4'-diaminodiphenyl ether, 4,4'-diaminodiphenyl ether, 3,3'-diaminodiphenylsulfide, 3,3'-diaminodiphenyl sulfoxide, 3,4'-diaminodiphenyl sulfoxide, 4,4'-diaminodiphenyl sulfoxide, 3,3'-diaminodiphenylsulfone, 3,4'-diaminodiphenylsulfone, 4,4'-diaminodiphenylsulfone, 3,3'-diaminobenzophenone, 3,4'-diaminobenzophenone, 4,4'-diaminobenzophenone, 3,3'-diaminodiphenylmethane, 3,4'-diaminodiphenylmethane, 4,4'-diaminodiphenylmethane, bis[4-(4-aminophenoxy)phenyl]methane, 1,1-bis[4-(4-aminophenoxy)phenyl]ethane, 1,2-bis[4-(4-aminophenoxy)phenyl]ethane, 1,1-bis[4-(4-aminophenoxy)phenyl]propane, 1,2-bis[4-(4-aminophenoxy)phenyl]propane, 1,3-bis[4-(4-aminophenoxy)phenyl]propane, 2,2-bis[4-(4-aminophenoxy)phenyl]propane, 1,1-bis[4-(4-aminophenoxy)phenyl]butane, 1,3-bis[4-(4-aminophenoxy)phenyl]butane, 1,4-bis[4-(4-aminophenoxy)phenyl]butane, 2,2-bis[4-(4-aminophenoxy)phenyl]butane, 2,3-bis[4-(4-aminophenoxy)phenyl]butane, 2-[4-(4-aminophenoxy)phenyl]-2-[4-(4-aminophenoxy)-3-methylphenyl]propane, 2,2-bis[4-(4-aminophenoxy)-3-methylphenyl]propane, 2-[4-(4-aminophenoxy)phenyl]-2-[4-(4-aminophenoxy)-3,5-dimethylphenyl]propane, 2,2-bis[4-(4-aminophenoxy)-3,5-dimethylphenyl]propane, 2,2-bis[4-(4-aminophenoxy)phenyl]-1,1,1,3,3,3-hexafluoropropane, 1,4-bis(3-aminophenoxy)benzene, 1,3-bis(3-aminophenoxy)benzene, 1,4-bis(4-aminophenoxy)benzene, 4,4'-bis(4-aminophenoxy)biphenyl, bis[4-(4-aminophenoxy)phenyl]ketone, bis[4-(4-aminophenoxy)phenyl]sulfide, bis[4-(4-aminophenoxy)phenyl]sulfoxide, bis[4-(4-aminophenoxy)phenyl]sulfone, bis[4-(3-aminophenoxy)phenyl]ether, bis[4-(4-aminophenoxy)phenyl]ether, 1,3-bis[4-(4-aminophenoxy)benzoyl]benzene, 1,3-bis[4-(3-aminophenoxy)benzoyl]benzene, 1,4-bis[4-(3-aminophenoxy)benzoyl]benzene, 4,4'-bis[(3-aminophenoxy)benzoyl]benzene, 1,1-bis[4-(3-aminophenoxy)phenyl]propane, 1,3-bis[4-(3-aminophenoxy)phenyl]propane, 3,4'-diaminodiphenylsulfide, 2,2-bis[3-(3-aminophenoxy)phenyl]-1,1,1,3,3,3-hexafluoropropane, bis[4-(3-aminophenoxy)phenyl]methane, 1,1-bis[4-(3-aminophenoxy)phenyl]ethane, 1,2-bis[4-(3-aminophenoxy)phenyl]ethane, bis[4-(3-aminophenoxy)phenyl]sulfoxide, 4,4'-bis[3-(4-aminophenoxy)benzoyl]diphenyl ether, 4,4'-bis[3-(3-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenylsulfone, bis[4-{4-(4-aminophenoxy)phenoxy}phenyl]sulfone, 1,4-bis[4-(4-aminophenoxy)phenoxy-α,α-dimethylbenzyl]benzene, 1,3-bis[4-(4-aminophenoxy)phenoxy-α,α-dimethylbenzyl]benzene, 1,3-bis[4-(4-amino-6-trifluoromethylphenoxy)-α,α-dimethylbenzyl]benzene, 1,3-bis[4-(4-amino-6-fluorophenoxy)-α,α-dimethylbenzyl]benzene, 1,3-bis[4-(4-amino-6-methylphenoxy)-α,α-dimethylbenzyl]benzene, 1,3-bis[4-(4-amino-6-cyanophenoxy)-α,α-dimethylbenzyl]benzene, 3,3'-diamino-4,4'-diphenoxybenzophenone, 4,4'-diamino-5,5'-diphenoxybenzophenone, 3,4'-diamino-4,5'-diphenoxybenzophenone, 3,3'-diamino-4-phenoxybenzophenone, 4,4'-diamino-5-phenoxybenzophenone, 3,4'-diamino-4-phenoxybenzophenone, 3,4'-diamino-5'-phenoxybenzophenone, 3,3'-diamino-4,4'-dibiphenoxybenzophenone, 4,4'-diamino-5,5'-dibiphenoxybenzophenone, 3,4'-diamino-4,5'-dibiphenoxybenzophenone, 3,3'-diamino-4-biphenoxybenzophenone, 4,4'-diamino-5-biphenoxybenzophenone, 3,4'-diamino-4-biphenoxybenzophenone, 3,4'-diamino-5'-biphenoxybenzophenone, 1,3-bis(3-amino-4-phenoxybenzoyl)benzene, 1,4-bis(3-amino-4-phenoxybenzoyl)benzene, 1,3-bis(4-amino-5-phenoxybenzoyl)benzene, 1,4-bis(4-amino-5-phenoxybenzoyl)benzene, 1,3-bis(3-amino-4-biphenoxybenzoyl)benzene, 1,4-bis(3-amino-4-biphenoxybenzoyl)benzene, 1,3-bis(4-amino-5-biphenoxybenzoyl)benzene, 1,4-bis(4-amino-5-biphenoxybenzoyl)benzene, 2,6-bis[4-(4-amino-α,α-dimethylbenzyl)phenoxy]benzonitrile, an aromatic diamine in which a part or all of the hydrogen atoms on the aromatic ring of the above-mentioned aromatic diamine is substituted with a halogen atom, an alkyl group or alkoxyl group with 1 to 3 carbon atoms, a cyano group, or a halogenated alkyl group or alkoxyl group with 1 to 3 carbon atoms allowing a part or all of the hydrogen atoms of the alkyl group or alkoxyl group to be substituted with a halogen atom, and the like.

Examples of the aliphatic diamines include 1,2-diaminoethane, 1,4-diaminobutane, 1,5-diaminopentane, 1,6-diaminohexane, 1,8-diaminooctane, and the like.

Examples of the alicyclic diamines include 1,4-diaminocyclohexane-4,4'-methylenebis(2,6-dimethylcyclohexylamine), and the like.

The total amount of diamines (aliphatic diamines and alicyclic diamines) other than the aromatic diamines is preferably 20% by mass or less, more preferably 10% by mass or less, and furthermore preferably 5% by mass or less in the total diamines. In other words, the amount of aromatic diamines is preferably 80% by mass or more, more preferably 90% by mass or more, and furthermore preferably 95% by mass or more in the total diamines.

As the tetracarboxylic acids constituting the polyamic acid, aromatic tetracarboxylic acids (including acid anhydrides thereof), aliphatic tetracarboxylic acids (including acid anhydrides thereof), and alicyclic tetracarboxylic acids (including acid anhydrides thereof) which are usually used for synthesizing a polyimide can be used. Among them, aromatic tetracarboxylic acid anhydrides and alicyclic tetracarboxylic acid anhydrides are preferable, and from the viewpoint of heat resistance, aromatic tetracarboxylic acid anhydrides are more preferable, and from the viewpoint of optical transparency, alicyclic tetracarboxylic acids are more preferable. When these compounds are acid anhydrides, although one anhydride structure may be contained or two anhydride structures may be contained in its molecule, one having two anhydride structures (a dianhydride) is preferred. The tetracarboxylic acids may be used alone or two or more thereof may be used in combination.

Examples of the alicyclic tetracarboxylic acids include alicyclic tetracarboxylic acids such as cyclobutanetetracarboxylic acid, 1,2,4,5-cyclohexanetetracarboxylic acid, and 3,3',4,4'-bicyclohexyltetracarboxylic acid, and acid anhydrides thereof. Among them, preferred are dianhydrides having two anhydride structures (for example, cyclobutanetetracarboxylic acid dianhydride, 1,2,4,5-cyclohexanetetracarboxylic acid dianhydride, and 3,3',4,4'-bicyclohexyltetracarboxylic acid dianhydride). The alicyclic tetracarboxylic acids may be used alone or two or more thereof may be used in combination.

When transparency is considered to be important, the amount of the alicyclic tetracarboxylic acids is preferably, for example, 80% by mass or more, more preferably 90% by mass or more, and furthermore preferably 95% by mass or more in the total tetracarboxylic acids.

The aromatic tetracarboxylic acids are not particularly limited, but pyromellitic acid residues (that is, those having a structure derived from pyromellitic acid) are preferable, and acid anhydrides thereof are more preferable. Examples of the aromatic tetracarboxylic acids include pyromellitic acid dianhydride, 3,3',4,4'-biphenyltetracarboxylic acid dianhydride, 4,4'-oxydiphthalic acid dianhydride, 3,3',4,4'-benzophenonetetracarboxylic acid dianhydride, 3,3',4,4'-diphenylsulfonetetracarboxylic acid dianhydride, 2,2-bis[4-(3,4-dicarboxyphenoxy)phenyl]propanoic acid anhydride, and the like.

When heat resistance is considered to be important, the amount of the aromatic tetracarboxylic acids is preferably, for example, 80% by mass or more, more preferably 90% by mass or more, and furthermore preferably 95% by mass or more in the total tetracarboxylic acids.

The polyimide film in the present invention has a glass transition temperature of 250° C. or higher, preferably 300° C. or higher, more preferably 350° C. or higher, or alternatively, the polyimide film is preferable to have no glass transition temperature observed in a range 500° C. or lower. The glass transition temperature in the present invention is determined by differential scanning calorimetry (DSC).

The coefficient of linear thermal expansion (CTE) of the polymer film in the present invention is preferably −5 ppm/K to +20 ppm/K, more preferably −5 ppm/K to +15 ppm/K, and more preferably 1 ppm/K to +10 ppm/K. When the CTE is within the foregoing range, a difference of the coefficient of linear thermal expansion from that of a common support can be kept so small as to avoid peeling of a polyimide film from a support made from an inorganic substance even in the process involving heating. Further, the coefficient of linear thermal expansion of the polyimide film of interest in the present invention is an average value between 30 to 200° C., but depending on the use, the temperature range to be focused changes, and when an investigation is carried out in a range of 30° C. to 400° C. while taking a high temperature into consideration, the temperature range may be in a range of 100° C. to 400° C. in some cases, and when an investigation is carried out in a range of 50° C. to 280° C. while taking a re-flow process into consideration, the temperature range of −50° C. to 150° C., as an employable temperature range, may be considered to be important in some cases.

The breaking strength of the polymer film in the present invention is 60 MPa or more, preferably 120 MP or more, and more preferably 240 MPa or more. The upper limit of the breaking strength is not limited, but actually is less than approximately 1000 MPa. Herein, the breaking strength of the polymer film means an average value in the longitudinal direction and width direction of the polymer film.

The adhesive strength between the polymer film and the inorganic substrate in the present invention is required to be ½ or less of the breaking strength of the polymer film.

Supposing that, in the laminated body of the present invention including a film with a thickness of 10 μm, the adhesive strength of the film is 0.5 N/cm, the breaking force to be applied to the film with a width of 10 mm becomes 0.5 N/(10 μm×10 mm)=0.5 N/0.1 mm²=5 MPa. In such a case, when the film has a breaking strength of approximately 10 times as high as the breaking force, that is, 50 MPa or more, the peeling operation can be carried out without any trouble at the time of peeling the film. The adhesive strength is preferably ⅓ or less, and more preferably ¼ or less of the breaking strength of the polymer film.

In the present invention, the well adhering part means a part with high adhesive strength between the inorganic substrate and the polyimide film, and in the present invention, the easily peelable part means a part with weak adhesive strength between the inorganic substrate and the polyimide film. The adhesive strength of the easily peelable part is preferably ½ or less, more preferably ⅓ or less, and furthermore preferably ¼ or less of the adhesive strength of the well adhering part. The lower limit of the adhesive strength is not particularly limited, but is preferably 0.5 N/cm or more in the well adhering part and 0.01 N/cm or more in the easily peelable part.

The thickness unevenness of the polymer film in the present invention is preferably 20% or less, more preferably 12% or less, furthermore preferably 7% or less, and particularly preferably 4% or less. If the thickness unevenness exceeds 20%, an application to a narrow part tends to be difficult. The thickness unevenness of the film may be determined by measuring a film thickness at about 10 points randomly sampled in an object film to be measured by, for example, a contact type thickness meter, and carrying out calculation according to the following equation.

Thickness unevenness of film (%)=100×(maximum film thickness−minimum film thickness)÷average film thickness The polymer film in the present invention is preferably a film that has a width of 300 mm or more and a length of 10 m or more at the time of production, and that is obtained in the form of being wound as a long polyimide film. The polymer film is more preferably a film in the form of a rolled polyimide film wound around a winding core.

For reliably securing handleability and productivity, a slip agent (particles) is preferably allowed to be added to and contained in the polymer film, so that the polymer film surface is imparted with fine projections and recessions and the slipping properties are secured. The slip agent (particles) is preferably made from fine particles of an inorganic substance, and particles of metals, metal oxides, metal nitrides, metal carbides, acid metal salts, phosphate salts, carbonate salts, talc, mica, clay, other clay minerals, and the like can be used. Preferably, metal oxides, phosphate salts and carbonate salts such as silicon oxide, calcium phosphate, calcium hydrogen phosphate, calcium dihydrogen phosphate, calcium pyrophosphate, hydroxyapatite, calcium carbonate, and glass filler can be used. The slip agents may be used alone or two or more thereof may be used.

The volume average particle diameter of the slip agent (particles) is normally 0.001 to 10 μm, preferably 0.03 to 2.5 μm, more preferably 0.05 to 0.7 μm, and furthermore preferably 0.05 to 0.3 μm. The volume average particle diameter is based on a measurement value obtained by a light-scattering method. The particle diameter smaller than the lower limit makes industrial production of the polymer film difficult, and the particle diameter exceeding the upper limit makes the projections and recessions on the surface too large, so that the bonding strength is weaken and there may possibly result in a trouble in practical uses.

The addition amount of the slip agent, as an addition amount to the polymer component in the polymer film, is 0.02 to 50% by mass, preferably 0.04 to 3% by mass, and more preferably 0.08 to 1.2% by mass. When the addition amount of the slip agent is too small, it is hard to cause the expected effect of the slip agent addition and is not so high to secure the slipping properties, resulting in a trouble in polymer film production in some cases. When the addition amount is too large, the projections and recessions on the film surface is so high that it may possibly cause problems of lowering the smoothness although the slipping properties are secured, lowering the breaking strength and rupture elongation of the polymer film, or increasing CTE in some cases.

When the slip agent (particles) is allowed to be added to and contained in the polymer film, the polymer film may be formed into a monolayer polymer film in which the slip agent is dispersed evenly; however, the polymer film may be formed into, for example, a multilayer polymer film constituted by a polymer film containing the slip agent in one surface and a polymer film containing no slip agent in the other surface or containing a small amount of the slip agent even if the slip agent is contained. In such a multilayer polymer film, one layer (film) surface is imparted with fine projections and recessions so that the slipping properties can be secured on the layer (film) surface, and good handleability and productivity can be secured.

When being a film produced by a melt drawing film formation method, the multilayer polymer film can be obtained by, for example, first producing a film from a polymer film raw material containing no slip agent and applying a resin layer containing a slip agent to at least one surface of the film during the process. Naturally, the film can be obtained contrarily by producing a film from a polymer film raw material containing a slip agent and applying a polymer film raw material containing no slip agent during the process or on completion of the film production.

Similarly to the case of a polymer film such as a polyimide film that is obtained by a solution film formation method, the polyimide film can be produced from two types of the following polyamic acid solutions: a polyamic acid solution (a precursor solution of polyimide) containing a slip agent (preferably average particle diameter of approximately 0.05 to 2.5 μm) in an amount of 0.02% by mass to 50% by mass (preferably 0.04 to 3% by mass, and more preferably 0.08 to 1.2% by mass) to the polymer solid matter in the polyamic acid solution and a polyamic acid solution containing no slip agent or containing a slip agent in a small amount (preferably less than 0.02% by mass, and more preferably less than 0.01% by mass to the polymer solid matter in the polyamic acid solution).

The multilayering (stacking) method of this multilayer polyimide film is not particularly limited as long as there occurs no problem on adhesion between both the layers and the method needs only to be one that brings the layers into close contact with each other without.

In the case of a polyimide film, examples of the method include i) a method of preparing one polyimide film, then continuously applying a polyamic acid solution for the other layer on the polyimide film and imidizing the film, ii) a method of casting a polyamic acid solution for one layer to prepare a polyamic acid film, then continuously applying a polyamic acid solution for the other layer to the polyamic acid film, and imidizing the film, iii) a method by coextrusion, iv) a method of applying a polyamic acid solution containing a large amount of a slip agent by spray coating, T-die coating, or the like onto a film formed of a polyamic acid solution containing no slip agent or containing a slip agent in a small amount, and imidizing the film, and the like. In the present invention, the i) method or the ii) method is preferably employed.

The ratio of the thickness of respective layers in the multilayer polymer film is not particularly limited, but the ratio of (a) layer/(b) layer is preferably 0.05 to 0.95 when the (a) layer is a polymer layer containing a large amount of a slip agent and the (b) layer is a polymer layer containing no slip agent or containing a slip agent in a small amount. If the ratio of (a) layer/(b) layer exceeds 0.95, the (b) layer tends to lose the smoothness, and on the other hand, if it is less than 0.05, the surface property improvement effect may possibly be insufficient to lose the easy slipping properties in some cases.

<Surface Activation Treatment for Polymer Film>

A polymer film to be used in the present invention is preferable to be subjected to a surface activation treatment. The surface activation treatment modifies the polymer film surface to be a state where functional groups exist (so-called activated state), and thus improves the adhesion of the polymer film surface to the silane coupling agent.

The surface activation treatment in the present invention is a dry or wet surface treatment. Examples of the dry surface treatment to be employed in the present invention may include a treatment of irradiating the surface with active energy beams such as ultraviolet rays, electron beams, or X-rays, a corona treatment, a vacuum plasma treatment, a normal pressure plasma treatment, a flame treatment, an Itro treatment, and the like. An example of the wet surface treatment may include a treatment of bringing the film surface into contact with an acid or alkaline solution. The surface activation treatment to be employed preferably in the present invention is a plasma treatment, and is a combination of a plasma treatment and a wet acid treatment.

Although the plasma treatment is not particularly limited, examples thereof include an RF plasma treatment in vacuum, a microwave plasma treatment, a microwave ECR plasma treatment, an atmospheric pressure plasma treatment, a corona treatment, and the like, and a fluorine-containing gas treatment, an ion implanting treatment using an ion source, a treatment using a PBII method, a flame treatment for exposure to heat plasma, an Itro treatment, and the like are also included. Among them, an RF plasma treatment in vacuum, a microwave plasma treatment, and an atmospheric pressure plasma treatment are preferred.

A condition suitable for the plasma treatment is desirably a treatment performed by plasma known to have a chemically high etching effect, such as oxygen plasma and plasma containing fluorine of $CF_4$ and $C_2F_6$, or by plasma high in effect of physical etching with applying to the polymer surface physical energy of plasma containing Ne, Ar, Kr, or Xe. Further, plasma containing $CO_2$, CO, $H_2$, $N_2$, $NH_4$, $CH_4$, a gas mixture thereof, or steam is also preferably added. In addition to these, it is necessary to generate plasma containing at least one type of component selected from the group consisting of OH, $N_2$, N, CO, $CO_2$, H, $H_2$, $O_2$, NH, $NH_2$, $NH_3$, COOH, NO, $NO_2$, He, Ne, Ar, Kr, Xe, $CH_2O$, $Si(OCH_3)_4$, $Si(OC_2H_5)_4$, $C_3H_7Si(OCH_3)_3$, and $C_3H_7Si(OC_2H_5)_3$ as a gas or as a decomposed substance. When the treatment is aimed to be completed within a short time, plasma having a high energy density, containing ions with high kinetic energy, and having a high number density of active species is desirable, but the heightening of the energy density is limited since surface smoothness is required. When oxygen plasma is employed, surface oxidation is promoted so that, although it is excellent in OH group production, a surface poor in adhesion force to a film itself can easily be formed, and surface unevenness (roughness) is large. Accordingly, adhesiveness is worsened.

Further, in the case of plasma containing Ar gas, the effect of physical collision is purely caused on the surface, and the surface is largely roughened also in this case. When these facts are comprehensively taken into consideration, a microwave plasma treatment, a microwave ECR plasma treatment, plasma irradiation using an ion source that can easily cause implantation of ions with high energy, a PBII method, and the like are also desirable.

The surface activation treatment cleans the polymer surface and further produces active functional groups. The produced functional groups can be bonded to the coupling agent layer by hydrogen bond or chemical reaction, so that the polymer film layer can be firmly bonded to the coupling agent layer.

In the plasma treatment, an effect of etching the polymer film surface can be also obtained. Particularly, in a polymer film containing a relatively large amount of slip agent particles, projections owing to the slip agent may possibly inhibit adhesion between the film and the inorganic substrate in some cases. In this case, the slip agent particles in the film surface periphery can be removed by thinly etching the polymer film surface by the plasma treatment to partially expose the slip agent particles and then carrying out a treatment with hydrofluoric acid.

The surface activation treatment may be carried out only for one surface of the polymer film or for both surfaces thereof. When the plasma treatment is carried out for one surface, the plasma treatment may be carried out only for one surface of the polymer film which is not brought into contact with an electrode by placing the polymer film on one side of the electrode in a contact manner in the plasma treatment by using parallel plate type electrodes. When the polymer film is placed in a state where the film electrically floats in the space between two electrodes, the plasma treatment is carried out for both surfaces. Further, a one surface treatment is made possible by performing the plasma treatment in a state where a protection film is bonded to one surface of the polymer film. A PET film, olefin film, or the like having a pressure-sensitive adhesive can be used as the protection film.

<Patterning Treatment for Polymer Film>

In the present invention, a patterning treatment can be carried out for the polymer film. Herein, patterning means formation of regions in which the application amount of the silane coupling agent, activity, or the like is intentionally adjusted. Accordingly, the patterning can provide a well adhering part and an easily peelable part with different adhesive strength between an inorganic substrate and a polymer film in a laminated body, and can form prescribed patterns of the well adhering part and the easily peelable part. An example of the silane coupling agent application as a patterning treatment may be a method for controlling the application amount of the silane coupling agent by using a mask previously prepared to have prescribed patterns. Further, a means of masking and scanning operation may be employed in combination to carry out patterning, when the surface coated with the silane coupling agent is irradiated with active energy rays. Herein, the active energy beam irradiation includes irradiation with energy beams such as ultraviolet rays, electron beams, and X-rays, as well as an ultraviolet irradiation treatment with extremely short wavelength which can cause an ultraviolet irradiation effect and simultaneously which can cause an effect of exposure to ozone gas generated in the periphery of the irradiated surface. Examples of the light source therefor include an excimer lamp, a low pressure mercury lamp, a high pressure mercury lamp, Xe excimer laser, ArF excimer laser, KrF excimer laser, a Xe lamp, XeCl excimer laser, XeF excimer laser, Ar laser, a D2 lamp, and the like. Among them, an excimer lamp, a low pressure mercury lamp, Xe excimer laser, ArF excimer laser, KrF excimer laser, and the like are preferable. In addition to these, treatments such as a corona treatment, a vacuum plasma treatment, a normal pressure plasma treatment, and sand blast can be employed to carry out the patterning treatment.

<Film Lamination Method>

In the present invention, a laminated body is obtained by using an inorganic substrate as a temporary support, bonding a polymer film to the inorganic substrate with a silane coupling agent interposed therebetween, and producing a film from the resultant in a dry manner. When the polymer film is bonded, the surface of the silane coupling agent layer of a polymer film coated with a layer of silane coupling agent is overlaid on the inorganic substrate for temporary support, and the resulting body is pressurized to obtain a laminated body.

The pressurizing treatment may be carried out by, for example, pressing, laminating, and roll laminating under an atmospheric pressure environment or in vacuum while heating is carried out. A method for pressuring-heating in a state where the polymer film and the inorganic substrate are put in a flexible gas may also be employed. From the viewpoint of productivity improvement and reduction of cost attributed to high productivity, pressing or roll laminating under an atmospheric pressure environment is preferable, and particularly, a method carried out using a roll (roll-laminating, etc.) is preferable.

The pressure at the time of the pressurizing treatment is preferably 1 MPa to 20 MPa, and more preferably 3 MPa to 10 MPa. If the pressure is too high, the support may be broken, and if the pressure is too low, parts which do not well adhere may be generated, and bonding may be insufficient in some cases.

The temperature at the time of the pressuring treatment is in a range not exceeding the heat resistant temperature of a polymer film to be employed. In the case of a non-thermoplastic polyimide film, the temperature at the time of the treatment is preferably 10° C. to 400° C., and more preferably 150° C. to 350° C.

The pressurizing treatment may be carried out in an atmospheric pressure environment as described above; however, in order to obtain stable adhesive strength in the entire surface, the treatment is preferably carried out in vacuum. The vacuum degree in this case is sufficiently a vacuum degree generated by a common oil rotary vacuum pump, and is sufficient to be approximately 10 Torr or less.

An apparatus to be used for the pressurizing-heating treatment may be, for example, "11FD" manufactured by Imoto Machinery Co., Ltd. when pressing is carried out in vacuum, and for example, "MVLP" manufactured by Meiki Co., Ltd. when vacuum lamination is carried out by a roll type film laminator in vacuum or by a film laminator for applying pressure at once to the entire glass surface through a thin rubber film after vacuum is generated.

The pressurizing treatment may be carried out separately into a pressurizing process and a heating process.

In this case, first a polymer film and an inorganic substrate are pressurized together (preferably approximately 0.2 to 50 MPa) at a relatively low temperature (for example, lower than 120° C. and more preferably 95° C. or lower) to secure adhesion between the two, and thereafter heated at a relatively high temperature (for example, 120° C. or higher, more preferably 120 to 250° C., furthermore preferably 150 to 230° C.) under a low pressure (preferably less than 0.2 MPa and more preferably 0.1 MPa or less) or under normal pressure to promote a chemical reaction in the adhesion interface, so that the polymer film and the inorganic substrate for a temporary support are stuck.

<Method for Producing Flexible Electronic Device>

The use of a laminated body according to the present invention can make preparation of a flexible electronic device possible by forming an electronic device on a polymer film of the laminated body through already existing facilities and processes for electronic device production and by peeling the electronic device together with the polymer film from the laminated body.

The electronic device in the present invention refers to a wiring substrate for electric wiring; an electronic circuit including an active element such as a transistor and a diode, and a passive device such as a resistor, a capacitor, and an inductor; a sensor element for sensing pressure, temperature, light and humidity; a light emitting element; an image display element such as a liquid crystal display, an electrophoresis display, and a spontaneous light emission display; a wireless or wire communication element; an arithmetic element; a memory element; an MEMS element; a solar cell; and a thin film transistor.

Examples of the method of peeling the polymer film from the laminated body may include a method of irradiating the laminated body from the inorganic substrate side with intense light and heat-decomposing or light-decomposing an adhering part between the inorganic substrate and the polymer film to cause peeling; a method of previously weakening the adhesive strength and pulling off the polymer film with force lower than the limiting value of the elastic strength of the polymer film; and a method of exposing the laminated body to heated water or heated stream to weaken the bonding strength of the interface between the inorganic substrate and the polymer film, so that peeling is carried out.

In the present invention, when the patterning treatment is performed in the inorganic substrate side or the polymer film side or both the polymer film and the inorganic substrate, an electronic device is formed in a region (referred to as easily peelable part) with adhesive force between the polymer film and the inorganic substrate lowered by the patterning treatment, and successively the outer circumference of the region is slit to peel the area of the polymer film where the electronic device is formed from the inorganic substrate, and accordingly, a flexible electronic device can be obtained. The method makes peeling of the polymer film from the inorganic substrate easier.

Examples of the method of slitting the polymer film along the outer circumference of the easily peelable part of the laminated body that can be used include a method of cutting the polymer film by a cutting tool such as a blade; a method of cutting the polymer film by relatively scanning laser and the laminated body; a method of cutting the polymer film by relatively scanning water jet and the laminated body; and a method of cutting the polymer film while slitting slightly to the glass layer by a dicing apparatus for semiconductor chips. Further, combinations of these methods and means of improving cutting performance by superimposing ultrasonic wave to a cutting tool, or adding reciprocating movement and up and down movement may appropriately be employed.

At the time of slitting the polymer film in the outer circumference of the easily peelable part of the laminated body, the position to be slit should include at least a part of the easily peelable part, and basically slitting may be carried out along a prescribed pattern, and may appropriately be determined from the viewpoint of absorption of errors and productivity.

Examples of the method of peeling the polymer film from the support may include, but are not particularly limited to, a method of peeling the polymer film from the rim end with tweezers; a method of bonding a pressure-sensitive adhesive tape to one side of a slit part of the polymer film bearing a device and thereafter peeling the polymer film from the tape; and a method of vacuum sucking one side of a slit part of the polymer film bearing a device and thereafter peeling the polymer film from the part. At the time of peeling, there is fear that occurrence of curling with a small curvature in a slit part of the polymer film bearing a device breaks the device due to stress application to the device in the part, and therefore it is desirable that the peeling is carried out with a curvature as high as possible. For example, it is desirable that peeling is carried out while winding the film on a roll with a large curvature or peeling is carried out by using a machine configured so as to dispose a roll with a large curvature in the peeling part.

Further, a method is also usable in which another reinforcing base material is previously bonded to a part to be peeled and then peeling of the part is carried out together with the reinforcing base material. When the flexible electronic device to be peeled is a back plane of a display device, a front plane of the display device is previously bonded and united onto the inorganic substrate, and then the two are simultaneously peeled to obtain a flexible display device.

<Recycling of Inorganic Substrate>

In the present invention, the inorganic substrate is made reusable by completely removing the remaining polymer film from the support substrate after the aimed electronic device is peeled and subjecting the support substrate to a simple cleaning treatment. In a conventional case where a silane coupling agent layer is formed by a liquid application, the inorganic substrate surface after peeling of the polymer film has projections and recessions or thickness unevenness of the silane coupling agent layer because of adhesion of aggregates of the silane coupling agent or other foreign matters, and it is therefore necessary to polish the surface layer of the inorganic substrate and to make the surface planar for reuse. According to the application method in the present invention, the surface of the inorganic substrate after the polymer film peeling has high quality and is no need to be polished again.

<Electronic Device>

A device in the present invention may be solely wiring for electronic circuit, a passive device such as an electric resistor, a coil, or a capacitor, an active device including a semiconductor element, and an electronic circuit system obtained by combining these, and examples of the semiconductor element include a solar cell, a thin film transistor, an MEMS element, a sensor, and a logic circuit.

A solar cell including the laminated body of the present invention comprising a polyimide film is obtained by forming a laminated body including a photoelectric conversion layer made of a semiconductor on a polyimide film base material of the laminated body. This laminated body comprises, as an indispensable component, a photoelectric conversion layer for conversing energy of sunlight into electric energy and generally further comprises an electrode layer for taking the obtained electric energy out.

Hereinafter, as a typical example of the above-mentioned laminated body formed so as to constitute a film-like solar cell, a laminated structure prepared by sandwiching a photoelectric conversion layer between a pair of electrode layers will be described. However, the constitution obtained by stacking several layers of the photoelectric conversion layer, and the like can also be referred to as the solar cell of the present invention when the layers are prepared by PVD or CVD. The laminated structure formed in the present invention is not limited to the embodiment described below, the constitution of a laminated product of the solar cell in the prior art may be appropriately referred to, and a protective layer and a known auxiliary means may be added thereto.

One electrode layer in the pair of electrode layers (hereinafter, also described as a back surface electrode layer) is preferably formed on one main surface of a polyimide film base material. The back surface electrode layer is obtained by stacking a conductive inorganic material by a method known per se, for example, a CVD (chemical vapor deposition) method or a sputtering method. Examples of the conductive inorganic material include metal thin films of Al, Au, Ag, Cu, Ni and stainless steel, oxide semiconductor-based conductive materials such as $In_2O_3$, $SnO_2$, ZnO, $Cd_2SnO_4$ and ITO (one prepared by adding Sn to $In_2O_3$), and the like. The thickness of the back surface electrode layer is not particularly limited, and is usually about 30 to 1000 nm. The back surface electrode layer is preferably a metal thin film. Moreover, one in which a part of the draw-out electrode is prepared by a film-forming method using an Ag paste or the like without utilizing vacuum can also be referred to as the solar cell of the present invention.

The photoelectric conversion layer that converts the energy of solar light into electric energy is a layer made of a semiconductor, and is a layer made of a $CuInSe_2$ (CIS) film which is a compound semiconductor thin film (chalcopyrite structure semiconductor thin film) made of a group I element, a group III element and a group VI element, or a $Cu(In, Ga)Se_2$ (CIGS) film which is prepared by dissolving Ga therein (hereinafter, the two are collectively referred to also as a CIS-based film), and a silicon-based semiconductor. Examples of the silicon-based semiconductor include a thin film silicon layer, an amorphous silicon layer, a polycrystalline silicon layer, and the like. The photoelectric conversion layer may be a laminated body having a plurality of layers made of different semiconductors. Moreover, the layer may be a photoelectric conversion layer prepared with a coloring matter. Furthermore, the layer may be one prepared with an organic thin film semiconductor made from an organic compound such as a conductive polymer and a fullerene.

The thin film silicon layer is a silicon layer obtained by a plasma CVD method, a heat CVD method, a sputtering method, an ionized cluster beam technique, a vapor deposition method, or the like.

The amorphous silicon layer is a layer made of silicon having substantially no crystallinity. Having substantially no crystallinity can be confirmed by giving no diffraction peak even when the layer is irradiated with X-rays. A means for obtaining an amorphous silicon layer is known, and examples of such means include a plasma CVD method, a heat CVD method, and the like.

The polycrystalline silicon layer is a layer made of an aggregate of microcrystals of silicon. The polycrystalline silicon layer is distinguished from the above-mentioned amorphous silicon layer by giving a diffraction peak when irradiated with X-rays. A means for obtaining a polycrystalline silicon layer is known, and examples of the means include a means for subjecting amorphous silicon to a heat treatment, and the like. The photoelectric conversion layer used in the present invention is not limited to a silicon-based semiconductor layer, and for example, the layer may be a thick film semiconductor layer. The thick film semiconductor layer is a semiconductor layer formed from a paste of titanium oxide, zinc oxide, copper iodide, and the like.

In the means for constituting a semiconductor material as the photoelectric conversion layer, a known method may be appropriately referred to. For example, an a-Si layer (n layer) of about 20 nm can be formed by performing high frequency plasma discharge in a gas prepared by adding phosphine ($PH_3$) to $SiH_4$ under a temperature of 200 to 500° C., subsequently, an a-Si layer (i layer) of about 500 nm can be formed in an $SiH_4$ gas only, and subsequently, by adding diborane ($B_2H_6$) to $SiH_4$, a p-Si layer (p layer) of about 10 nm can be formed.

Among the pair of electrode layers sandwiching the photoelectric conversion layer, an electrode layer disposed at the opposite side of a polyimide film base material (hereinafter, also referred to as a current collecting electrode layer) may be an electrode layer prepared by hardening a conductive paste containing a conductive filler and a binder resin, or may be a transparent electrode layer. As the transparent electrode layer, an oxide semiconductor-based material such as $In_2O_3$, $SnO_2$, ZnO, $Cd_2SnO_4$ and ITO (one prepared by adding Sn to $In_2O_3$), and the like can be preferably used.

Thus, a film-like solar cell, which is a preferred example of the embodiment of the present invention, prepared by stacking the transparent electrode/p-type a-Si/i-type a-Si/n-type a-Si/metal electrode/polyimide film in this order is obtained. Moreover, an a-Si layer as the p layer and a polycrystalline silicon layer as the n layer may be employed to obtain a structure prepared by interposing a thin undoped a-Si layer between the two. Particularly, when an a-Si/polycrystalline silicon-based hybrid type one is prepared, the sensitivity to a solar light spectrum is improved. In the preparation of a solar cell, in addition to the above-mentioned constitution, an antireflection layer, a surface protective layer, and the like may be added.

An adaptation example of the thin film transistor (TFT) is one in which a semiconductor layer constituting a transistor, and an insulation film, an electrode, a protective insulation film, and the like constituting an element are prepared by depositing a thin film. The thin film transistor usually differs from one in which the silicon in a silicon wafer is used as a semiconductor layer. The thin film is usually prepared by a method utilizing vacuum such as PVD (physical vapor deposition) including vacuum deposition and CVD (chemical vapor deposition) including plasma CVD. Accordingly, one which is not single crystal like a silicon wafer is included. Even when Si is used, a microcrystalline silicon TFT, a high temperature polysilicon TFT, a low temperature polysilicon TFT, an oxide semiconductor TFT, an organic semiconductor TFT, and the like are included.

The MEMS element refers to an article prepared by using the MEMS technique, and adaptation examples thereof include an inkjet printer head, a probe for a scanning type probe microscope, a contactor for an LSI prober, a spatial light modulator for maskless exposure, an optical integrated element, an infrared ray sensor, a flow-rate sensor, an acceleration sensor, an MEMS gyro sensor, an RF MEMS switch, an internal/external body blood pressure sensor, and a video projector using a grating light valve, a digital micromirror device, or the like.

Adaptation examples of the sensor include a strain gauge, a load cell, a semiconductor pressure sensor, a light sensor, a photoelectric element, a photodiode, a magnetic sensor, a contact type temperature sensor, a thermistor temperature sensor, a resistor bulb temperature sensor, a thermocouple temperature sensor, a noncontact temperature sensor, a radiation thermometer, a microphone, an ion concentration sensor, a gas concentration sensor, a displacement sensor, a potentiometer, a differential transformer displacement sensor, a rotation angle sensor, a linear encoder, a tacho generator, a rotary encoder, a position sensitive detector (PSD), an ultrasonic distance meter, an electrostatic capacitance displacement meter, a laser Doppler vibration speedometer, a laser Doppler velocimeter, a gyro sensor, an acceleration sensor, an earthquake sensor, a one-dimensional image, a linear image sensor, a two-dimensional image, a CCD image sensor, a CMOS image sensor, a liquid/liquid leakage sensor (a leak sensor), a liquid detection sensor (a level sensor), a hardness sensor, an electric field sensor, a current sensor, a voltage sensor, an electric power sensor, an infrared ray sensor, a radiation sensor, a humidity sensor, an odor sensor, a flow-rate sensor, an inclination sensor, a vibration sensor, a time sensor, a composite sensor prepared by composing these sensors, a sensor in which, from a value detected by any of these sensors, another physical value or sensitivity index is output based on some kind of calculation formula, and the like.

Adaptation examples of the logic circuit include logic circuit based on NAND and OR, and one in which the synchronization is acquired by a clock.

These laminated bodies can be used for metallization and successive pattern production to provide good patterns, and can stand the processes for device production. Particularly, since having high heat resistance, the laminated body can be used in a wide range of devices to be produced, and is significantly useful for production of device structure bodies such as an extremely small and thin sensor display device, a probe, an integrated circuit, a composite device thereof, an amorphous Si thin film solar cell, a Se or CIGS-based compound semiconductor thin film solar cell substrate, and a solar cell including them. Accordingly, the laminated body can contribute greatly to the industrial fields.

EXAMPLES

Hereinafter, the present invention will be described in more detail with reference to examples and comparative examples, but the present invention is not limited by the following examples. The methods of evaluating physical properties in the following examples are as follows.

1. Reduced Viscosity ($\eta sp/C$) of Polyamic Acid

A solution prepared by dissolving a polymer in N-methyl-2-pyrrolidone (or N,N-dimethylacetamide) so that the polymer concentration became 0.2 g/dl was measured at 30° C. with an Ubbelohde type viscosity tube (when the solvent used for the preparation of the polyamic acid solution was N,N-dimethylacetamide, a polymer was dissolved in N,N-dimethylacetamide and the reduced viscosity was measured).

2. Thickness of Polyimide Film or the Like

The thickness was measured using a micrometer (manufactured by Feinpruf, Millitron 1245D).

3. Tensile Elastic Modulus, Tensile Breaking Strength, and Tensile Breaking Elongation of Polyimide Film One prepared by cutting a polyimide film as a measuring object into a strip shape with a size of 100 mm in the flow direction (MD direction)×10 mm in the widthwise direction (TD direction) was employed as a test specimen. Using a tensile testing machine (available from Shimadzu Corporation, Autograph (R) model name AG-5000A), under the conditions of a tensile speed of 50 mm/minute and a distance between chucks of 40 mm, with regard to each of the MD direction and the TD direction, the tensile elastic modulus, the tensile breaking strength and the tensile breaking elongation were measured.

4. 90-Degree Peel Strength

The 90-degree peeling test was performed under the following conditions according to a 90-degree peeling method of JIS K 6854-1 to determine the peel strength of a laminated body. Moreover, for this measurement, separately, a sample which is not subjected to UV irradiation was prepared, and the measurement for peel strength was performed. This sample was constituted so that the polyimide film had a size of 110 mm×200 mm while the glass had a size of 100 mm square, and on one side thereof, an unbondable part in the polyimide film was prepared so that this part constituted "a grasping margin".

Apparatus mane; Autograph AG-IS, manufactured by Shimadzu Corporation

Measurement temperature; Room temperature

Peeling speed; 50 mm/min

Atmosphere; Atmospheric air

Width of measurement sample; 1 cm

The sample was constituted so that the polyimide film had a size of 110 mm×200 mm while the glass had a size of 100 mm square, and on one side thereof, an unbondable part in the polyimide film was prepared so that this part constituted "a grasping margin".

With regard to the heat resistant peel strength, a laminated body prepared under the same condition was placed in a muffle furnace through which $N_2$ was passed and allowed to have a nitrogen atmosphere, and the laminated body was heated at a heating rate of 10° C./minute to 440° C. and held in place at 400° C. for 1 hour. Subsequently, the door of the muffle furnace was opened and the laminated body was allowed to spontaneously cool under an air atmosphere. A heat treatment was performed. With regard to this laminated body after cooling, the peel strength was determined in the same manner as above under the conditions of room temperature and atmospheric pressure.

As heat-moisture peel strength, in a PCT chamber, a laminated body which had been allowed to stand under an environment of a saturated water vapor pressure, 2 atm and 121° C. for 96 hours was taken out therefrom into the air, and then the peel strength was determined in the same manner as above under the conditions of room temperature and atmospheric pressure.

5. Coefficient of Linear Thermal Expansion (CTE)

A polyimide film as a measuring object was measured for the expansion/contraction rate in the flow direction (MD direction) and the widthwise direction (TD direction) under the following conditions. Values of the expansion/contraction rate/temperature in the ranges at 15° C. intervals of 30° C. to 45° C., 45° C. to 60° C., . . . were measured, and this measurement was carried out until the temperature reached 300° C., and an average value of all the measured values was calculated as the CTE.

Apparatus name; TMA 4000S manufactured by MAC Science Co., Ltd.

Sample length; 20 mm
Sample width; 2 mm
Temperature rising onset temperature; 25° C.
Temperature rising end temperature; 400° C.
Rate of temperature rise; 5° C./min
Atmosphere; Argon
Initial load; 34.5 g/mm$^2$ 6. Average Particle Diameter of Inorganic Particles Inorganic particles as a measuring object were dispersed in a solvent as described below, the particle diameter distribution was determined on a laser scattering type particle size analyzer LB-500 manufactured by HORIBA, Ltd., and the weight (volume) average particle diameter and the CV value were calculated.

7. Method for Measuring Thickness of Coupling Agent Layer

As the coupling agent layer thickness, the thickness of a film formed on an Si wafer was measured.

With regard to the measuring method for film thickness, the measurement was performed by ellipsometry, and as a measuring instrument, FE-5000 manufactured by Photal was used.

The hardware specifications of the measuring instrument are as follows.

Reflection angle range 45 to 80°; wavelength range 250 to 800 nm; wavelength resolution 1.25 nm; spot diameter 1 mm; tan Ψ measurement accuracy ±0.01; cos Δ measurement accuracy ±0.01; mode rotating analyzer method. The measurement was performed under the conditions of polarizer angle 45°; incidence 70° fixed, analyzer of 0 to 360° in 11.25° increments, and 250 to 800 nm.

The film thickness was determined by fitting using a nonlinear least-squares method. In this case, as the model, with a model of Air/Thin film/Si, C1 to C6 were determined as the wavelength-dependence by the equations of:

$n = C3/\lambda 4 + C2/\lambda 2 + C1$ and $k = C6/\lambda 4 + C5/\lambda 2 + C4$.

8. Evaluation of Polyimide Film: Roll Winding Properties

When long type multilayer polyimide films were wound on a winding roll (outer diameter of a core rod: 15 cm) at a speed of 2 m/min, those which could be wound without wrinkles were marked with ○: those with partial wrinkles were marked with Δ: and those wrinkled or impossible to be wound smoothly because of entangling on the roll were marked with x.

9. Dry Nitrogen

In examples, when the "dry nitrogen" was described, nitrogen with a dew point of −10° C. or lower was used. The purity of the nitrogen was 99.9% or more.

10. Polymer Film Surface Roughness

Polymer film surface roughness in the tables of the examples shows three-dimensional surface roughness Sa after silane coupling agent application to each polymer film.

11. The three-dimensional arithmetic average roughness (Sa) of SC layer was measured using a noncontact surface-layer cross section measurement system (VertScan$^R$ 2.0, manufactured by Ryoka Systems Inc.). The measurement was carried out in the following conditions.

Measurement mode: Phase mode
Visual field size: 640×480
Filter used: 520 nm filter
Object lens magnification: ×5
Zoom lens magnification: ×1
Measurement range for every measurement: 1.4 mm×1.8 mm
Integrated number of times: 1 time The raw data obtained in the above-mentioned conditions was not interpolated but only corrected by 4th-order datum correction to obtain measurement data. The three-dimensional arithmetic average roughness was calculated from the measurement data based on the following equation.

$$S_a = \frac{1}{l_x \cdot l_y} \int \int |Z(x, y)| dx dy \quad \text{[Numerical Formula 1]}$$

($l_x$ and $l_y$ denote range in x-direction and y-direction, respectively, and Z(x,y) denotes height from average plane)

<Foreign Matter Density>

A region of 100 mm×100 mm was sampled, and the sampled region was observed by a microscope having a magnification of 100 times and a length measurement function. The foreign matters each observed by the observation at 100 times magnification were subjected to major axis length measurement at 400 times magnification, the number of foreign matters having a major axis length of 10 μm or more was counted, and the number was divided by the observation area to measure the foreign matter density. The unit of the foreign matter density is (piece(s)/m$^2$).

Production Examples 1 and 2

(Preparation of Polyamic Acid Solutions A1 and A2)

After the inside of a reaction container equipped with a nitrogen introduction tube, a thermometer and a stirring rod was replaced with nitrogen, 223 parts by mass of 5-amino-2-(p-aminophenyl)benzoxazole and 4416 parts by mass of N,N-dimethylacetamide were added thereto and completely dissolved. Then, 217 parts by mass of pyromellitic acid dianhydride and SNOWTEX prepared by dispersing colloidal silica in dimethylacetamide (DMAC-ST30, manufactured by Nissan Chemical Industries, Ltd.) in an amount that the silica content becomes the content described in Table 1 were added thereto. The liquid was stirred at a reaction temperature of 25° C. for 24 hours, and then each of brown viscous polyamic acid solutions A1 and A2 was obtained.

TABLE 1

|  | unit | Production Example 1 | Production Example 2 |
|---|---|---|---|
| Polyamic acid solution |  | A1 | A2 |
| Kind of slip agent |  | silica | — |
| Particle size of slip agent | μm | 0.08 | — |

TABLE 1-continued

|  | unit | Production Example 1 | Production Example 2 |
|---|---|---|---|
| Addition amount of slip agent | % by mass | 0.35 | 0 |
| Reduced viscosity η sp/C | dl/g | 2.2 | 2.1 |

Production Examples 3 and 4

(Preparation of Polyamic Acid Solutions B1 and B2)

After the inside of a reaction container equipped with a nitrogen introduction tube, a thermometer and a stirring rod was replaced with nitrogen, 398 parts by mass of 3,3',4,4'-biphenyltetracarboxylic acid dianhydride as a tetracarboxylic acid dianhydride and 147 parts by mass of paraphenylenediamine were dissolved in 4600 parts by mass of N,N-dimethylacetamide. Then, SNOWTEX prepared by dispersing colloidal silica in dimethylacetamide (DMAC-ST30, manufactured by Nissan Chemical Industries, Ltd.) in an amount that the silica content becomes the content described in Table 2 was added thereto. The liquid was stirred at a reaction temperature of 25° C. for 24 hours, and then each of brown viscous polyamic acid solutions B1 and B2 was obtained.

TABLE 2

|  | unit | Production Example 1 | Production Example 2 |
|---|---|---|---|
| Polyamic acid solution |  | B1 | B2 |
| Kind of slip agent |  | silica | — |
| Particle size of slip agent | μm | 0.08 | — |
| Addition amount of slip agent | % by mass | 0.4 | 0 |
| Reduced viscosity η sp/C | dl/g | 2.5 | 2.5 |

Film Preparation Example 1

The polyamic acid solution A1 was applied to a slip agent material-free surface of a polyethylene terephthalate film A-4100 (manufactured by Toyobo Co., Ltd.) using a comma coater, and dried at 110° C. for 5 minutes, and then a polyamic acid film was wound without peeling from a support.

The obtained polyamic acid film was attached to an unwinding part of a film-forming machine. The polyamic acid solution A2 was applied to a polyamic acid film surface using a comma coater so as to attain the thickness ratio with the polyamic acid solution A1 shown in Table 3, and dried at 110° C. for 20 minutes to obtain a two-layered polyamic acid film. The total thickness of the two layers after the heat treatment was adjusted as shown in Table 3

Next, the obtained multi-layered polyamic acid film was passed through a pin tenter having three heat treatment zones, was subjected to heat treatments of the first 150° C.×2 minutes stage, the second 220° C.×2 minutes stage and the third 475° C.×4 minutes stage, and was slit so as to have a width of 500 mm to obtain a polyimide film. In this case, after the heat treatment and before winding, as a releasable non-polyimide protective film, a PET film (film A) provided with a slightly adhesive layer was laminated at the polyamic acid solution A1 side to be wound. The obtained polyimide film was defined as a film 1. The characteristics of the polyimide film are shown in Table 3.

Film Preparation Example 2

A film 2 was obtained in the same manner as in Preparation Example 1, except that the coating thickness of each of the polyamic acid solutions A1 and A2 was changed so as to attain the value shown in Table 3. The characteristics are shown in Table 3 in the same manner as in Preparation Example 1.

Film Preparation Example 3

A film 3 was obtained in the same manner as in Preparation Example 1, except that the coating thickness of each of the polyamic acid solutions B1 and B2 was changed so as to attain the value shown in Table 3. The characteristics are shown in Table 3 in the same manner as in Preparation Example 1.

As a film 4, a 100 μm-thick polyethylene terephthalate film A4100 (manufactured by Toyobo Co., Ltd.) was used.

TABLE 3

|  | Preparation Example 1 | Preparation Example 2 | Preparation Example 3 |
|---|---|---|---|
| Film NO. | 1 | 2 | 3 |
| Using polyamic acid solution (a) | A1 | A2 | B2 |
| Using polyamic acid solution (b) | — | A1 | B1 |
| (Layer a)thickness | 38 | 5 | 10 |
| (Layer b)thickness | 0 | 15 | 15 |
| Thickness of polyimide film | 38 | 20 | 25 |
| CTE of polyimide film | 3.5 | 2.8 | 5.5 |
| Tensile elastic modulus of polyimide film | 8.2 | 8.8 | 8.5 |
| Roll winding property | ○ | ○ | ○ |

<Coupling Agent Layer Formation on Polymer Film>

Application Example 1

Using a vacuum chamber having a hot plate, silane coupling agent application to a polymer film was carried out in the following condition.

A Petri dish was filled with 100 parts by mass of a silane coupling agent ("KBM-903", manufactured by Shin-Etsu Chemical Co., Ltd.: 3-aminopropyltrimethoxysilane) and allowed to stand still on the hot plate. The hot plate temperature at this time was 25° C. While being fixed in an SUS frame, a polymer film having a size of 350 mm×490 mm was held perpendicularly at a point 100 mm or more apart from the liquid level of the silane coupling agent in the horizontal direction, the vacuum chamber was closed, and evacuation and nitrogen introduction were carried out several times and repeated until the oxygen concentration in atmospheric pressure became 0.1% or less. Then, the inside of the chamber was pressure-reduced to $3 \times 10^{-1}$ Pa, and the hot plate temperature was increased to 60° C. and kept for 10 minutes to expose the polymer film to the silane coupling agent vapor. Thereafter, the hot plate temperature was lowered and simultaneously clean dry nitrogen gas was calmly introduced from four points into the vacuum chamber to return the pressure to the atmospheric pressure, and then the polymer film fixed in the frame was taken out and placed, all together with the SUS frame, on the hot plate at 100° C. under a clean environment. Owing to the thickness of the SUS frame, the polymer film is heated without having direct contact with the hot plate. The heat treatment was carried out for about 3 minutes to obtain a polymer film S1 in which the silane coupling agent layer was formed on both surfaces.

Application Example 2

Using a vacuum chamber for setting a polymer film therein and an apparatus for volatilizing a silane coupling agent, a silane coupling agent layer was formed on a polymer film in the following condition. The polymer film had a protection film bonded to one surface of the polymer film. The polymer film having a size of 350 mm×490 mm and having a protection film bonded thereto was fixed in an SUS frame, held perpendicularly and set in the vacuum chamber. Thereafter, the vacuum chamber was closed and the inside of the vacuum chamber was pressure-reduced to −0.099 MPa. Thereafter, nitrogen introduction and evacuation were carried out several times and repeated until the oxygen concentration in atmospheric pressure became 0.1% or less. After the vacuum chamber was evacuated to be vacuum, a silane coupling agent ("KBM-903", manufactured by Shin-Etsu Chemical Co., Ltd.: 3-aminopropyltrimethoxysilane) was led to an apparatus which generated silane coupling agent vapor by blowing a carrier gas to the silane coupling agent liquid level, while controlling the temperature of the silane coupling agent solution, and the temperature was controlled to be 30° C., and thereafter, nitrogen gas with a purity of 99.9% or more was flown. The generated nitrogen gas containing the silane coupling agent was introduced into the vacuum chamber through a pipe controlled to a temperature of 25° C. until the inside of the vacuum chamber became substantially atmospheric pressure (until the vacuum degree became −0.009 MPa) and kept for 20 minutes. Thereafter, the vacuum chamber was evacuated to be vacuum again and nitrogen gas was introduced to return the pressure to the atmospheric pressure. Then, the polymer film was taken out of the vacuum chamber, the protection film was peeled therefrom, and the resultant product was subjected to a heat treatment on a hot plate of 100° C. for about 3 minutes to obtain a polymer film coated with a layer of silane coupling agent S2 of the present invention in which the silane coupling agent was stuck on one surface of the polymer film. This vacuum chamber is installed in a room controlled to room temperature of 25° C.

Application Example 3

Using a vacuum chamber for setting a polymer film therein and an apparatus (FIG. 2) for volatilizing a silane coupling agent, a silane coupling agent layer was formed on a polymer film in the following condition. The polymer film had a protection film bonded to one surface of the polymer film. The polymer film having a size of 350 mm×490 mm and having a protection film bonded thereto was fixed in an SUS frame, and held perpendicularly and set in the vacuum chamber. Thereafter, the vacuum chamber was closed and the inside of the vacuum chamber was pressure-reduced to −0.099 MPa. Thereafter, nitrogen introduction and evacuation were carried out several times and repeated until the oxygen concentration in atmospheric pressure became 0.1% or less. After the vacuum chamber was evacuated to be vacuum, a silane coupling agent ("KBM-903", manufactured by Shin-Etsu Chemical Co., Ltd.: 3-aminopropyltrimethoxysilane) was led to an apparatus which generated silane coupling agent vapor by placing a gas introduction tube in a manner that the tip end of the tube made of a porous ceramic for easily generating bubbles was immersed in the silane coupling agent solution and blowing a carrier gas to the silane coupling agent liquid level, while controlling the temperature of the silane coupling agent solution, and the temperature was controlled to be 20° C., and thereafter, nitrogen gas with a purity of 99.9% or more was flown. The generated nitrogen gas containing the silane coupling agent was introduced into the vacuum chamber through a pipe controlled to a temperature of 25° C. until the vacuum degree became +0.009 MPa, and then a discharge port was once opened and closed so that the pressure became substantially atmospheric pressure, and the nitrogen gas was kept for 20 minutes. Thereafter, the vacuum chamber was evacuated to be vacuum again and nitrogen gas was introduced to return the pressure to the atmospheric pressure. Then, the polymer film was taken out of the vacuum chamber, the protection film was peeled therefrom, and the resultant product was subjected to a heat treatment on a hot plate of 100° C. for about 3 minutes to obtain a polymer film coated with a layer of silane coupling agent S3 of the present invention in which the silane coupling agent was stuck on one surface of the polymer film. This vacuum chamber is installed in a room controlled to room temperature of 25° C.

Application Example 4

Using a vacuum chamber for setting a polymer film therein and an apparatus for volatilizing a silane coupling agent, a silane coupling agent layer was formed on a polymer film in the following condition. The polymer film had a protection film bonded to one surface of the polymer film. The polymer film having a size of 350 mm×490 mm and having a protection film bonded thereto was fixed in an SUS frame, held perpendicularly and set in the vacuum chamber. Thereafter, the vacuum chamber was closed and the inside of the vacuum chamber was pressure-reduced to −0.099 MPa. Thereafter, nitrogen introduction and evacuation were carried out several times and repeated until the oxygen concentration in atmospheric pressure became 0.1% or less. After the vacuum chamber was evacuated to be vacuum, a silane coupling agent ("KBM-903", manufactured by Shin-Etsu Chemical Co., Ltd.: 3-aminopropyltrimethoxysilane) was led to an apparatus which generated silane coupling agent vapor by placing a gas introduction tube in a manner that the tip end of the tube made of a porous ceramic for easily generating bubbles was immersed in the silane coupling agent solution and blowing a carrier gas to the silane coupling agent liquid level, while controlling the temperature of the silane coupling agent solution, and the temperature was controlled to be 20° C., and thereafter, nitrogen gas with a purity of 99.9% or more was flown. The generated nitrogen gas containing the silane coupling agent was introduced into the vacuum chamber through a pipe controlled to a temperature of 25° C. until the vacuum degree became −0.09 MPa, and kept for 5 minutes. Thereafter, the vacuum chamber was evacuated to be vacuum again, and then the nitrogen gas containing the silane coupling agent was introduced into the vacuum chamber until the inside of the vacuum chamber had a vacuum degree of −0.09 MPa, and kept for 5 minutes. This operation was repeated four times, coating was carried out for 40 minutes, and thereafter, nitrogen gas was introduced to return the pressure to the atmospheric pressure. Then, the polymer film was taken out of the vacuum chamber, the protection film was peeled therefrom, and the resultant product was subjected to a heat treatment on a hot plate of 100° C. for about 3 minutes to obtain a polymer film coated with a layer of silane coupling agent S4 of the present invention in which the silane coupling agent was stuck on one surface of the polymer film. This vacuum chamber is installed in a room controlled to room temperature of 25° C.

Application Example 5

A polymer film coated with a layer of silane coupling agent S5 of the present invention in which the silane coupling agent was stuck on one surface of the polymer film was obtained by the operation of Application Example 3, except that an SUS plate was placed in the side opposite to the bonding of the polymer film and the electric potential was set to +3 kV.

Application Example 6

A polymer film coated with a layer of silane coupling agent S6 of the present invention in which the silane coupling agent was stuck on one surface of the polymer film was obtained by the operation of Application Example 3, except that the gas to be employed was changed from nitrogen gas with a purity of 99.9% or more to clean dry air.

Application Example 7

In a vacuum chamber in which a polymer film was placed, vacuum evacuation and nitrogen introduction were repeated until the oxygen concentration in atmospheric pressure became 0.1% or lower, and thereafter, clean dry air adjusted to 25° C. and 60% RH was separately introduced until the pressure became −0.19 MPa. Then, the generated clean dry air containing the silane coupling agent was introduced into the vacuum chamber through a pipe controlled to a temperature of 25° C. until the vacuum degree became +0.009 MPa, and then a discharge port was once opened and closed so that the pressure became substantially atmospheric pressure, and the clean dry air was kept for 20 minutes. A polymer film coated with a layer of silane coupling agent S7 of the present invention in which the silane coupling agent was stuck on one surface of the polymer film was obtained by the operation of Application Example 3, except that the above-mentioned steps were performed.

Application Example 8

After the operation of Application Example 3, a mask made of a 1 mm-thick stainless steel having prescribed patterns was overlaid on the silane coupling agent-coated surface of the polymer film, and UV/ozone irradiation was carried out for 120 seconds using a UV/ozone irradiation apparatus manufactured by LAN Technical Service Co., Ltd., so that a polymer film coated with a layer of silane coupling agent S8 of the present invention in which the silane coupling agent was stuck on one surface of the polymer film was obtained.

Application Example 9

After the operation of Application Example 1, a mask made of a 1 mm-thick stainless steel having prescribed patterns was overlaid on one surface of the polymer film, and UV/ozone irradiation was carried out for 120 seconds using a UV/ozone irradiation apparatus manufactured by LAN Technical Service Co., Ltd., so that a polymer film coated with a layer of silane coupling agent S9 of the present invention in which the silane coupling agent was stuck on both surfaces of the polymer film was obtained.

Application Example 10

After the inside gas of a glove box was replaced with dry nitrogen, 0.5 parts by mass of a silane coupling agent ("KBM-903", manufactured by Shin-Etsu Chemical Co., Ltd.: 3-aminopropyltrimethoxysilane) and 99.5 parts by mass of isopropyl alcohol were stirred and mixed in a clean glass container while a small amount of dry nitrogen is flown, so that a silane coupling agent solution was obtained. On the other hand, a glass plate for liquid crystal having a size of 370 mm×470 mm×0.7 mmt was set in a spin coater manufactured by Japancreate Co., Ltd., 50 ml of isopropyl alcohol was dropped in the center of the glass plate and spun off at 500 rpm to clean the glass plate. Then, about 30 ml of the previously prepared silane coupling agent solution was dropped to the center of the glass plate, the glass plate was rotated at 500 ml for 10 seconds, then the rotating speed was increased to 1500 rpm, and the glass plate was rotated at the rotation speed for 20 seconds, so that the previously prepared silane coupling agent solution was spun off. Successively, the glass plate was taken out of the stopped spin coater, placed on a hot plate at 100° C. under a clean environment with the silane coupling agent-coated surface facing upside, and subjected to a heat treatment for about 3 minutes, so that a polymer film S10 in which a silane coupling agent layer was formed on one surface of the polymer film was obtained.

Application Example 11

A polymer film coated with a layer of silane coupling agent S11 of the present invention in which the silane coupling agent was stuck on one surface of the polymer film was obtained by the operation of Application Example 2, except that the time to introduce the nitrogen gas containing the silane coupling agent into the vacuum chamber was changed to 60 minutes.

Application Example 12

A polymer film coated with a layer of silane coupling agent S12 of the present invention in which the silane coupling agent was stuck on both surface of the polymer film was obtained by the operation of Application Example 1, except that the time to keep the temperature of the hot plate on which the silane coupling agent was set at 60° C. was changed to 60 minutes.

Application Example 13

A polymer film coated with a layer of silane coupling agent S13 of the present invention in which the silane coupling agent was stuck on one surface of the polymer film was obtained by the operation of Application Example 4, except that the time to introduce the nitrogen gas containing the silane coupling agent into the vacuum chamber was changed to 60 minutes.

Application Example 14

A polymer film coated with a layer of silane coupling agent S14 of the present invention in which the silane coupling agent was stuck on one surface of the polymer film was obtained by the operation of Application Example 3, except that the time to introduce the nitrogen gas containing the silane coupling agent into the vacuum chamber was changed to 60 minutes.

Application Example 15

A polymer film coated with a layer of silane coupling agent S15 of the present invention in which the silane coupling agent was stuck on one surface of the polymer film was obtained by the operation of Application Example 3, except that a Cu plate welded with a water-cooling pipe was placed in the side opposite to the bonding of the polymer film to cool the polymer film to 5° C., the gas employed was changed from nitrogen gas with a purity of 99.9% or more to clean dry air, and the time to introduce the clean dry air containing the silane coupling agent into the vacuum chamber was changed to 60 minutes.

Application Example 16

A mask made of a 1 mm-thick stainless steel having prescribed patterns was overlaid on the polymer film S1 obtained in Application Example 10, and UV/ozone irradiation was carried out for 120 seconds using a UV/ozone irradiation apparatus manufactured by LAN Technical Service Co., Ltd., so that a patterned polymer film SP 1 was obtained. The obtained polymer films are shown in Table 3.

TABLE 4

| Application Example | Atmosphere | SCA supplying method | Holding polymer substrate |
|---|---|---|---|
| 1 | vacuum | heating | SUS frame |
| 2 | dryN2 | heating | SUS frame |
| 3 | dryN2 | bubbling | SUS frame |
| 4 | vacuum | bubbling | SUS frame |
| 5 | dryN2 | bubbling | SUS frame + SUS plate |
| 6 | CDA | bubbling | SUS frame |
| 7 | CDA | bubbling | SUS frame |
| 8 | dryN2 | bubbling | SUS frame |
| 9 | vacuum | heating | SUS frame |
| 10 | atmosphere | spin coating | vacuum sucking disk + porous film |
| 11 | dryN2 | heating | SUS frame |
| 12 | vacuum | heating | SUS frame |
| 13 | vacuum | bubbling | SUS frame |
| 14 | dryN2 | bubbling | SUS frame |
| 15 | CDA | bubbling | SUS frame + Cu plate |
| 16 | air | spin coating | vacuum sucking disk + porous film |

In the table, SCA means a silane coupling agent and CDA means clean dry air.

Laminated Examples 1 to 12 and 17 to 20

The silane coupling agent layer side of each of the obtained silane coupling agent layer-bearing polymer films and a non-alkaline glass plate (OA-10G, manufactured by Nippon Electric Glass Co., Ltd.) having a size of 370 mm×470 mm×0.7 mmt were temporarily laminated in the 10 mm inner side from the outer circumference of the Si wafer at a roll pressure of 8 kgf/cm$^2$ and a rolling speed of 5 mm/second by using a precision sheet-bonding machine (SE 650 nH, manufactured by Climb Products). After the temporary lamination, the film had adhesiveness in a degree such that the film is not peeled from the glass plate by self-weight but is easily peeled when the film rim part is scratched. Thereafter, the obtained temporarily laminated substrate was placed in a clean oven, heated at 200° C. for 30 minutes, and then cooled to room temperature to obtain a laminated body. The polymer films and the coating examples shown in the table were used, respectively, to obtain Laminated Examples 1 to 12.

Laminated Examples 13 and 14

The silane coupling agent layer side of each of the obtained silane coupling agent layer-bearing polymer films and a φ200 mm Si wafer (thickness of 0.7 mm) were temporarily laminated in the 10 mm inner side from the outer circumference of the glass at a roll pressure of 8 kgf/cm$^2$ and a rolling speed of 5 mm/second by using a precision sheet-bonding machine (SE 650 nH, manufactured by Climb Products). In this case, the polymer film used was one punched to have a size of φ180 mm by a Thomson mold. After the temporary lamination, the film had adhesiveness in a degree such that the film is not peeled from the glass plate by self-weight but is easily peeled when the film rim part is scratched. Thereafter, the obtained temporarily laminated substrate was placed in a clean oven, heated at 200° C. for 30 minutes, and then cooled to room temperature to obtain a laminated body. The polymer films and the coating examples shown in the table were used, respectively, to obtain Laminated Examples 1 to 12. Laminated Examples were carried out in the same manner for the respective polymer films of the coating examples other than Laminated Examples 13 and 14, except that a silicon wafer was used in place of glass as the support, and the results were approximately same as those of the case of using glass.

Laminated Examples 15 and 16

The silane coupling agent layer side of each of the obtained silane coupling agent layer-bearing polymer films and a 200 mm-square SUS plate (thickness of 1 mm) were temporarily laminated in the 10 mm inner side from the outer circumference of the glass at a roll pressure of 8 kgf/cm$^2$ and a rolling speed of 5 mm/second by using a precision sheet-bonding machine (SE 650 nH, manufactured by Climb Products). In this case, the polymer film used was one cut to have a size of 180 mm square. After the temporary lamination, the film had adhesiveness in a degree such that the film is not peeled from the glass plate by self-weight but is easily peeled when the film rim part is scratched. Thereafter, the obtained temporarily laminated substrate was placed in a clean oven, heated at 200° C. for 30 minutes, and then cooled to room temperature to obtain a laminated body. The polymer films and the coating examples shown in the table were used, respectively, to obtain Laminated Examples 1 to 12. Laminated Examples were carried out in the same manner for the respective polymer films of the coating examples other than Laminated Examples 15 and 16, except that an SUS plate was used in place of glass as the support, and the results were approximately same as those of the case of using glass.

Preparation of a laminated body was tried using films of Film Treatment Comparative Examples 1 to 5 in the same manner as in Laminated Example 1. The results are shown in Table 5.

Examples 1 to 20 and Comparative Examples 1 to 7

TABLE 5

|  | Example 1 | Example 2 | Example 3 | Example 4 | Example 5 | Example 6 | Example 7 | Example 8 | Example 9 | Example 10 |
| --- | --- | --- | --- | --- | --- | --- | --- | --- | --- | --- |
| Polymer film | 1 | 1 | 1 | 1 | 1 | 2 | 2 | 2 | 2 | 2 |
| Surface activation treatment | No | No | No | No | No | No | No | No | No | No |
| Patterning | No | No | No | No | No | No | No | Yes | Yes | No |
| Application method | 1 | 2 | 3 | 4 | 5 | 1 | 2 | 3 | 4 | 5 |
| Coated surface of polymer film | both surfaces | A1 | A1 | A1 | A1 | both surfaces | A2 | A2 | A2 | A1 |
| Surface roughness of polymer film coated with SC layer (nm) | 0.5 | 0.8 | 0.5 | 0.4 | 0.5 | 0.8 | 0.4 | 0.8 | 0.8 | 0.7 |
| Thickness of SC layer (nm) | 17 | 13 | 19 | 18 | 12 | 14 | 21 | 13 | 17 | 26 |
| Foreign matter density | 300 | 500 | 500 | 500 | 400 | 600 | 600 | 300 | 700 | 400 |

|  | Laminated Example 1 | Laminated Example 2 | Laminated Example 3 | Laminated Example 4 | Laminated Example 5 | Laminated Example 6 | Laminated Example 7 | Laminated Example 8 | Laminated Example 9 | Laminated Example 10 |
| --- | --- | --- | --- | --- | --- | --- | --- | --- | --- | --- |
| Inorganic substance | glass for liquid crystal | glass for liquid crystal | glass for liquid crystal | glass for liquid crystal | glass for liquid crystal | glass for liquid crystal | glass for liquid crystal | glass for liquid crystal | glass for liquid crystal | glass for liquid crystal |
| 90-degree peel strength (N/cm) | 4 | 5.4 | 2.8 | 4.6 | 5.2 | 4.6 | 1.9 | 5.1 | 2.9 | 4.5 |
| 90-degree peel strength (N/cm) in an easily peelable part | — | — | — | — | — | — | — | 0.2 | 0.3 | — |
| Quality of appearance | good | good | good | good | good | good | good | good | good | good |

|  | Example 11 | Example 12 | Example 13 | Example 14 | Example 15 | Example 16 | Example 17 | Example 18 | Example 19 | Example 20 |
| --- | --- | --- | --- | --- | --- | --- | --- | --- | --- | --- |
| Polymer film | 2 | 2 | 2 | 2 | 2 | 2 | 3 | 3 | 4 | 4 |
| Surface activation treatment | No | No | No | No | No | No | No | No | No | No |
| Patterning | No | No | No | No | No | No | No | No | Yes | Yes |
| Application method | 6 | 7 | 1 | 3 | 2 | 4 | 1 | 3 | 8 | 9 |
| Coated surface of polymer film | A2 | A2 | both surfaces | A2 | A1 | A2 | B2 | B2 | smooth surface | both surfaces |
| Surface roughness of polymer film coated with SC layer (nm) | 1.2 | 0.7 | 0.9 | 0.9 | 1.4 | 0.6 | 0.4 | 1 | 0.7 | 0.7 |
| Thickness of SC layer (nm) | 37 | 32 | 27 | 38 | 36 | 18 | 16 | 22 | 17 | 15 |
| Foreign matter density | 400 | 500 | 400 | 200 | 700 | 500 | 500 | 400 | 600 | 300 |

|  | Laminated Example 11 | Laminated Example 12 | Laminated Example 13 | Laminated Example 14 | Laminated Example 15 | Laminated Example 16 | Laminated Example 17 | Laminated Example 18 | Laminated Example 19 | Laminated Example 20 |
| --- | --- | --- | --- | --- | --- | --- | --- | --- | --- | --- |
| Inorganic substance | glass for liquid crystal | glass for liquid crystal | Si | Si | SUS plate | SUS plate | glass for liquid crystal | glass for liquid crystal | glass for liquid crystal | glass for liquid crystal |
| 90-degree peel strength (N/cm) | 4.3 | 4.5 | 3.2 | 3.2 | 4.8 | 4.1 | 2.9 | 5.5 | 3.5 | 2.4 |
| 90-degree peel strength (N/cm) in an easily peelable part | — | — | — | — | — | — | — | — | 0.2 | 0.2 |
| Quality of appearance | good | good | good | good | good | good | good | good | good | good |

|  | Comparative Example 1 | Comparative Example 2 | Comparative Example 3 | Comparative Example 4 | Comparative Example 5 | Comparative Example 6 | Comparative Example 7 |
| --- | --- | --- | --- | --- | --- | --- | --- |
| Polymer film | 2 | 2 | 2 | 1 | 2 | 2 | 2 |
| Surface activation treatment | No | No | No | No | No | No | No |
| Patterning | No | No | No | No | No | No | Yes |
| Application method | 10 | 11 | 12 | 13 | 14 | 15 | 16 |

TABLE 5-continued

| Coated surface of polymer film | A2 | A2 | both surfaces | A1 | A2 | A1 | A2 |
|---|---|---|---|---|---|---|---|
| Surface roughness of polymer film coated with SC layer (nm) | 6.7 | 5.2 | 6.5 | 7.1 | 9.3 | 6.1 | 8.8 |
| Thickness of SC layer (nm) | 159 | 174 | 165 | 136 | 54 | 45 | 52 |
| Foreign matter density | 3700 | 2400 | 2600 | 2300 | 2200 | 2700 | 4200 |

|  | Laminated Comparative Example 1 | Laminated Comparative Example 2 | Laminated Comparative Example 3 | Laminated Comparative Example 4 | Laminated Comparative Example 5 | Laminated Comparative Example 6 | Laminated Comparative Example 7 |
|---|---|---|---|---|---|---|---|
| Inorganic substance | glass for liquid crystal | glass for liquid crystal | glass for liquid crystal | glass for liquid crystal | glass for liquid crystal | glass for liquid crystal | glass for liquid crystal |
| 90-degree peel strength (N/cm) | 0.2 | 0.2 | 0.2 | 0 | 0.4 | 0.1 | 0.4 |
| 90-degree peel strength (N/cm) in an easily peelable part | — | — | — | — | — | — | 0.2 |
| Quality of appearance | poor | poor | poor | poor | poor | poor | poor |

<<Surface Activation Treatment Example for Polymer Film>>

The films No. 1 to 4 were used and the sides (A2 layer surface or B2 layer surface) of the films which contained no slip agent were subjected to an activation treatment by a vacuum plasma treatment to obtain activated films. The vacuum plasma treatment was a treatment by RIE mode RF plasma using parallel flat plate type electrodes, and the flow rate of $N_2$ gas and the flow rate of Ar gas in the vacuum chamber were controlled by a mass flow controller to have a ratio of 20 SCCM:10 SCCM. A formalin bath was set in the middle of a $N_2$ gas introduction pipe upstream from the mass flow controller while being kept from the outer air, and formaldehyde vapor was introduced together with the $N_2$ gas in such a manner that the $N_2$ gas was brought into contact with the formalin liquid level. The treatment was carried out for 2 minutes by introducing a high frequency electric power of 13.56 MHz.

Examples 21 to 40 and Comparative Examples 8 to 14

The same operations as in Examples 1 to 20 and Comparative Examples 1 to 7 were carried out, except that activated films corresponding to the films obtained by the activation treatment were used. The results are shown in Table 6.

TABLE 6

|  | Example 21 | Example 22 | Example 23 | Example 24 | Example 25 | Example 26 | Example 27 | Example 28 | Example 29 | Example 30 |
|---|---|---|---|---|---|---|---|---|---|---|
| Polymer film | 1 | 1 | 1 | 1 | 1 | 2 | 2 | 2 | 2 | 2 |
| Surface activation treatment | Yes | Yes | Yes | Yes | Yes | Yes | Yes | Yes | Yes | Yes |
| Patterning | No | No | No | No | No | No | No | Yes | Yes | No |
| Application method | 1 | 2 | 3 | 4 | 5 | 1 | 2 | 3 | 4 | 5 |
| Coated surface of polymer film | both surfaces | A1 | A1 | A1 | A1 | both surfaces | A2 | A2 | A2 | A1 |
| Surface roughness of polymer film coated with SC layer (nm) | 0.5 | 0.9 | 0.4 | 0.5 | 0.6 | 1.1 | 0.4 | 0.7 | 0.8 | 0.6 |
| Thickness of SC layer (nm) | 18 | 18 | 21 | 15 | 14 | 10 | 20 | 13 | 20 | 29 |
| Foreign matter density | 300 | 600 | 600 | 500 | 500 | 800 | 600 | 400 | 695 | 484 |

|  | Laminated Example 21 | Laminated Example 22 | Laminated Example 23 | Laminated Example 24 | Laminated Example 25 | Laminated Example 26 | Laminated Example 27 | Laminated Example 28 | Laminated Example 29 | Laminated Example 30 |
|---|---|---|---|---|---|---|---|---|---|---|
| Inorganic substance | glass for liquid crystal | glass for liquid crystal | glass for liquid crystal | glass for liquid crystal | glass for liquid crystal | glass for liquid crystal | glass for liquid crystal | glass for liquid crystal | glass for liquid crystal | glass for liquid crystal |
| 90-degree peel strength (N/cm) | 5.6 | 7.1 | 4.3 | 6.8 | 5.5 | 6.3 | 2.8 | 5.2 | 3.1 | 5.2 |
| 90-degree peel strength (N/cm) in an easily peelable part | — | — | — | — | — | — | — | 0.3 | 0.3 | — |
| Quality of appearance | good | good | good | good | good | good | good | good | good | good |

TABLE 6-continued

|  | Example 31 | Example 32 | Example 33 | Example 34 | Example 35 | Example 36 | Example 37 | Example 38 | Example 39 | Example 40 |
|---|---|---|---|---|---|---|---|---|---|---|
| Polymer film | 2 | 2 | 2 | 2 | 2 | 2 | 3 | 3 | 4 | 4 |
| Surface activation treatment | Yes | Yes | Yes | Yes | Yes | Yes | Yes | Yes | Yes | Yes |
| Patterning | No | No | No | No | No | No | No | No | Yes | Yes |
| Application method | 6 | 7 | 1 | 3 | 2 | 4 | 1 | 3 | 8 | 9 |
| Coated surface of polymer film | A2 | A2 | both surfaces | A2 | A1 | A2 | B2 | B2 | smooth surface | both surfaces |
| Surface roughness of polymer filmcoated with SC layer (nm) | 1.1 | 0.7 | 0.9 | 0.8 | 1.0 | 0.5 | 0.4 | 0.8 | 0.5 | 0.5 |
| Thickness of SC layer (nm) | 43 | 41 | 27 | 33 | 36 | 13 | 15 | 29 | 16 | 18 |
| Foreign matter density | 600 | 500 | 400 | 200 | 700 | 500 | 600 | 300 | 600 | 300 |
|  | Laminated Example 31 | Laminated Example 32 | Laminated Example 33 | Laminated Example 34 | Laminated Example 35 | Laminated Example 36 | Laminated Example 37 | Laminated Example 38 | Laminated Example 39 | Laminated Example 40 |
| Inorganic substance | glass for liquid crystal | glass for liquid crystal | Si | Si | SUS plate | SUS plate | glass for liquid crystal | glass for liquid crystal | glass for liquid crystal | glass for liquid crystal |
| 90-degree peel strength (N/cm) | 3.8 | 3.0 | 2.6 | 3.5 | 5.1 | 3.7 | 2.4 | 6.4 | 3.5 | 2.6 |
| 90-degree peel strength (N/cm) in an easily peelable part | — | — | — | — | — | — | — | — | 0.3 | 0.3 |
| Quality of appearance | good | good | good | good | good | good | good | good | good | good |

|  | Comparative Example 8 | Comparative Example 9 | Comparative Example 10 | Comparative Example 11 | Comparative Example 12 | Comparative Example 13 | Comparative Example 14 |
|---|---|---|---|---|---|---|---|
| Polymer film | 3 | 3 | 3 | 3 | 3 | 3 | 3 |
| Surface activation treatment | Yes | Yes | Yes | Yes | Yes | Yes | Yes |
| Patterning | No | No | No | No | No | No | Yes |
| Application method | 10 | 11 | 12 | 13 | 14 | 15 | 16 |
| Coated surface of polymer film | B2 | B2 | both surfaces | B1 | B2 | B1 | B2 |
| Surface roughness of polymer filmcoated with SC layer (nm) | 6.7 | 6.5 | 5.8 | 6.1 | 8.9 | 5.2 | 10.4 |
| Thickness of SC layer (nm) | 128 | 210 | 117 | 141 | 53 | 34 | 54 |
| Foreign matter density | 5600 | 3000 | 2300 | 3400 | 2700 | 2300 | 5100 |
|  | Laminated Comparative Example 8 | Laminated Comparative Example 9 | Laminated Comparative Example 10 | Laminated Comparative Example 11 | Laminated Comparative Example 12 | Laminated Comparative Example 13 | Laminated Comparative Example 14 |
| Inorganic substance | glass for liquid crystal | glass for liquid crystal | glass for liquid crystal | glass for liquid crystal | glass for liquid crystal | glass for liquid crystal | glass for liquid crystal |
| 90-degree peel strength (N/cm) | 0.6 | 0.5 | 0.4 | 0.1 | 0.6 | 0.1 | 0.5 |
| 90-degree peel strength (N/cm) in an easily peelable part | — | — | — | — | — | — | 0.3 |
| Quality of appearance | poor | poor | poor | poor | poor | poor | poor |

Adaptation Example 1

Each laminated body obtained in the laminated Examples was fixed on a substrate holder in a sputtering apparatus while a stainless frame having an aperture part was set thereon. The substrate holder and the support surface are fixed in a closely adhering manner. The temperature of the film can therefore be set by leading a refrigerant to the substrate holder. The substrate temperature was set to 2° C. Next, the film surface was subjected to a plasma treatment. The plasma treatment conditions were set to a frequency of 13.56 MHz, an output power of 200 W, and a gas pressure of $1 \times 10^{-3}$ Torr in argon gas, the treatment temperature was 2° C., and the treatment time was 2 minutes. Next, under the conditions of a frequency of 13.56 MHz, an output power of 450 W, and a gas pressure of $3 \times 10^{-3}$ Torr, a 11 nm-thick nickel-chromium alloy coating (underlayer) was formed at a rate of 1 nm/s in an argon atmosphere by DC magnetron sputtering with use of a nickel-chromium (chromium 10% by mass) alloy target. Then, the temperature of the substrate was set to 2° C. by bringing the back surface of the substrate to the sputtered surface into contact with the SUS plate of the substrate holder to which the cooling medium controlled at a temperature of 3° C. was led, and the sputtering was carried out. Copper was vapor deposited at 10 nm/second rate to form a 0.22 μm-thick thin copper film. A metal thin film-formed film as an underlayer was obtained from each film. The thickness of the copper film and that of the NiCr layer were confirmed by a fluorescent x-ray analysis.

Thereafter, a stuck plate bearing a metal thin film-formed film as an underlayer produced from each film was fixed in a frame made of Cu, and a thick copper layer was formed using a copper sulfate plating bath. Electrolytic plating conditions were set to, by immersing in an electrolytic plating solution (80 g/L copper sulfate, 210 g/L sulfuric acid, HCl, and a small amount of a brightening agent), and by applying electric power at 1.5 Adm$^2$. Thus, a thick copper plating layer (thick layer) with 4 μm thickness was formed. Successively, the stuck plate was heated at 120° C. for 10 minutes, followed by drying, to obtain a metalized polyimide film-glass laminated body.

After applying a photoresist (FR-200, manufactured by Shipley) to each the obtained metalized polyimide film-glass laminated body, followed by drying, the photoresist was exposed through a closely set glass photomask and developed with an aqueous 1.2 mass % KOH solution. Next, etching was carried out at 40° C. and 2 kgf/cm$^2$ spray pressure along an etching line of a cupric chloride containing HCl and hydrogen peroxide to form lines of line/space=20 μm/20 μm as a test pattern. Next, after electroless tin plating with 0.5 μm thickness was performed, annealing treatment was carried out at 125° C. for 1 hour. A dripping, pattern residues, and pattern peeling in the formed test pattern were observed with an optical microscope.

In each of the film/inorganic substrate laminated bodies of Examples 1 to 40, a good pattern free from smear, pattern residues, and pattern peeling was obtained. Further, even if the film/inorganic substrate laminated bodies of Examples 1 to 18 and Examples 21 to 38 were heated to 400° C. at a temperature rising speed of 10° C./minute in a muffle furnace replaced with nitrogen, kept at 400° C. for 1 hour, and spontaneously allowed to cool, no blister, peeling or the like occurred.

In each of the film/inorganic substrate laminated bodies of Comparative Examples 1 to 14, film peeling was occurred, and no good pattern was obtained.

Example 41

N,N-dimethylacetamide as an organic polar solvent, 1,3-bis(3-aminophenoxy)benzene and 3,3'-dihydroxy-4,4'-diaminobiphenyl at a molar ratio of 9:1 as a diamine compound, and 3,3',4,4'-ethylene glycol benzoate tetracarboxylic acid dianhydride as an ester tetracarboxylic acid were used to give a polyamic acid polymer solution. This polyamic acid polymer solution was heated under reduced pressure to obtain a thermoplastic polyimide. Eight (8) grams of this thermoplastic polyimide, 10 g of Epicoat 1032H 60 as a thermosetting resin (epoxy resin), and 3.0 g of 4,4'-diaminodiphenyl ether as a curing agent were added to and stirred with 91.0 g of dioxolane as an organic solvent to dissolve them in the solvent. Accordingly, an adhesive solution (A) was obtained. The obtained adhesive solution was applied to the coated surface of the film, which was the film used in Example 21 and coated with the silane coupling agent after film activation, by an applicator and dried at 60° C. for 20 minutes to form an adhesive layer with a thickness of 7.5 μm. About 40 mm of the film rim part was not coated with an adhesive and used as a grasping margin at the time of peeling test. Two sheets of the film were overlaid in the adhesive layer side and heated at 120° C. for 30 minutes by a vacuum press to obtain an adhesion evaluation sample. The 90-degree peel strength between the film sheets of the obtained sample was 12.4 N/cm. The peeled surface was found causing inner layer breakage of the adhesive layer.

Comparative Example 15

Adhesive application was carried out in the same manner as in Example 41, except that the film obtained in Film Preparation Example 1 was used as it was, to obtain an adhesion evaluation sample. The 90-degree peel strength between the film sheets of the obtained sample was 2.7 N/cm. The peeled surface was the interface between the adhesive layer and the polyimide film.

Example 42

Fifteen (15) parts by weight of cresol novolak type epoxy resin YDCN 703 manufactured by Tohto Kasei Co., Ltd. was added to 100 parts by mass of a 30 wt % solution of polyester-polyurethane resin UR-8200 (manufactured by Toyobo Co., Ltd.), and they were sufficiently mixed to obtain an adhesive solution (B). Herein, the solvent is a solvent mixture of MEK/toluene/cyclohexane at 6/3/1 (mass ratio).

The obtained adhesive solution was applied to the coated surface of the film, which was the film used in Example 40 and coated with the silane coupling agent after film activation, by an applicator and dried at 100° C. for 60 minutes to form an adhesive layer with a thickness of 10 μm. About 40 mm of the film rim part was not coated with an adhesive and used as a grasping margin at the time of peeling test. Two sheets of the film were overlaid in the adhesive layer side and heated at 120° C. for 30 minutes by a vacuum press to obtain an adhesion evaluation sample. The 90-degree peel strength between the film sheets of the obtained sample was 15.3 N/cm. The peeled surface was found causing inner layer breakage of the adhesive layer.

Comparative Example 16

Application of the adhesive solution (B) was carried out in the same manner as in Example 41, except that the film 4, a 100 μm-thick polyethylene terephthalate film A4100 (manufactured by Toyobo Co., Ltd.) was used as it was, to obtain an adhesion evaluation sample. The 90-degree peel strength between the film sheets of the obtained sample was 3.2 N/cm. The peeled surface was the interface between the adhesive layer and the polyimide film.

Example 43

A reaction container equipped with a thermometer, a stirrer, a refluxing type cooling tube, and a distilling tube was loaded with 100 parts by weight of toluene, 38 parts by weight of nitrile-butadiene rubber NIPOL 1001 (manufactured by Nippon Zeon Co., Ltd., nitrile content 40.5% by weight), and 4 parts by weight of nitrile-butadiene rubber NIPOL 1312 (manufactured by Nippon Zeon Co., Ltd., nitrile content 31 to 36%), and after these compounds were dissolved, 58 parts by weight of phenol-novolak type epoxy resin BREN(R)S (manufactured by Nippon Kayaku Co., Ltd.) and 0.6 parts by weight of an imidazole compound, Curezol 2E4MZ-CN, (manufactured by Shikoku Chemicals Corp.) were added thereto and sufficiently mixed to obtain an adhesive solution (C).

The obtained adhesive solution was applied to the coated surface of the film, which was the film used in Example 20 and coated with the silane coupling agent after film activation, by an applicator and dried at 120° C. for 30 minutes to form an adhesive layer with a thickness of 10 μm. About 40 mm of the film rim part was not coated with an adhesive and used as a grasping margin at the time of peeling test. The adhesion treatment surface of a rolled copper foil BHY-22-T (18 μm) manufactured by Japan Energy Corporation was bonded to the adhesive coated surface of the film, lamination was carried out by a silicon rubber roller type laminator at a roll temperature of 120° C. and a feeding speed of 60 cm/min. The resulting product was wound, and subjected to a treatment at 150° C. for 5 hours in a vacuum drier to cure the adhesive, so that a flexible stuck film lined with copper was obtained. The obtained flexible stuck film lined with copper had a 90-degree peel strength between the copper foil and the film of 14.5 N/cm. The peeled surface was found causing inner layer breakage of the adhesive layer.

Comparative Example 17

Adhesive application was carried out in the same manner as in Example 43, except that the film obtained in Film Preparation Example 1 was used as it was, to obtain an adhesion evaluation sample. The 90-degree peel strength between the film sheets of the obtained sample was 3.5 N/cm. The peeled surface was the interface between the adhesive layer and the polyimide film.

Adaptation Example 2

In Example 43, the film activation treatment and the silane coupling agent application were carried out for both surfaces, and the adhesive application and bonding of the copper foil were also carried out for both surfaces to obtain a flexible stuck film lined with copper on both surfaces. Next, according to the following common both surfaces through-hole circuit processing processes, the obtained stuck film lined with copper was subjected to perforation, and thickening through electroless copper plating and electrolytic copper plating. Then, dry film resists were bonded to both surfaces of the stuck film, the resulting product was subjected to exposure, development by an aqueous sodium carbonate solution, etching with an aqueous ferric chloride solution, resist removing with an aqueous sodium hydroxide solution, washing, and tin plating with a thickness of 1.5 μm, so that a both surfaces through-hole circuit substrate was obtained. During the processing processes, no troubles such as peeling of the copper foil occurred and thus the stuck film was confirmed to have good processing suitability.

INDUSTRIAL APPLICABILITY

The laminated body obtained by using the polymer film in the present invention is a laminated body obtained by bonding one surface of an inorganic substrate such as a glass plate, a ceramic plate, a silicon wafer, or a metal to one surface of the polymer film without an adhesive layer interposed therebetween, and use of the laminated body makes it possible to obtain a device-bearing polymer film.

The laminated body obtained by using the polyimide film in the present invention as a polymer film is effectively usable for processes for producing a device structure body or the like on a thin and flexible polyimide film, further if necessary, the support can be smoothly peeled from the film, and circuit or device formation is accurately made possible on a polymer film thin and excellent in insulating properties, heat resistance, and dimensional stability, so that the laminated body is effective for a sensor, a display device, a probe, an integrated circuit, a composite device thereof, an amorphous Si thin film solar cell, a Se or CIGS-based compound semiconductor thin film solar cell substrate, and a solar cell including them.

These laminated bodies can be used for metallization and successive pattern production to provide good patterns, and can stand the processes for device production. Particularly, since having high heat resistance, the laminated body can be used in a wide range of devices to be produced, and is significantly useful for production of device structure bodies such as an extremely small and thin sensor display device, a probe, an integrated circuit, a composite device thereof, an amorphous Si thin film solar cell, a Se or CIGS-based compound semiconductor thin film solar cell substrate, and a solar cell including them.

Further, since having good adhesiveness with an adhesive, the polymer film in the present invention has high applicability with conventionally existing processes. Accordingly, the present invention significantly contributes to industrial fields.

EXPLANATION OF SIGNS (FIG. 1)
1: Well adhering part
2: Easily peelable part

The invention claimed is:
1. A method for producing a laminated body, comprising:
(1) forming a silane coupling agent layer on a polymer film comprising:
providing the polymer film;
placing the polymer film in a vacuum chamber;
evacuating the vacuum chamber to vacuum;
vaporizing a silane coupling agent, wherein the silane coupling agent is vaporized in a bubbling manner using a carrier gas having a dew point of less than 15° C.;
refilling the vacuum chamber with the vaporized silane coupling agent and carrier gas to a pressure of atmospheric pressure;
exposing the polymer film to the vaporized silane coupling agent; and
heating the polymer film exposed to the vaporized silane coupling agent to a temperature of 70° C. to 200° C., thereby forming the silane coupling agent layer on the polymer film,
wherein the silane coupling agent layer has a three-dimensional surface roughness (Sa) of 5.0 nm or less;
(2) subjecting the silane coupling agent layer on the polymer film to an active energy irradiation treatment;
(3) superposing the polymer film in which the silane coupling agent layer is subjected to an active energy irradiation treatment on an inorganic substrate; and
(4) bonding the inorganic substrate and polymer film by pressurization.
2. The method for producing the laminated body according to claim 1, wherein the carrier gas has a dew point of 0° C. or lower.
3. The method for producing the laminated body according to claim 1, wherein a gas with a dew point of 5° C. or higher is present during the exposing step.

4. The method for producing the laminated body according to claim 1, wherein an electric field is applied to the polymer film when the polymer film is exposed to the vaporized silane coupling agent.

* * * * *